United States Patent
Kamochi et al.

(10) Patent No.: US 10,442,961 B2
(45) Date of Patent: Oct. 15, 2019

(54) COMPOSITION, PROCESS FOR PRODUCING SHEET, SHEET, LAMINATE, AND LAMINATE WITH DEVICE WAFER

(71) Applicant: FUJIFILM Corporation, Tokyo (JP)

(72) Inventors: Yoshitaka Kamochi, Haibara-gun (JP); Ichiro Koyama, Haibara-gun (JP); Yu Iwai, Haibara-gun (JP); Atsushi Nakamura, Haibara-gun (JP); Mitsuru Sawano, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/468,288

(22) Filed: Mar. 24, 2017

(65) Prior Publication Data

US 2017/0198176 A1   Jul. 13, 2017

Related U.S. Application Data

(63) Continuation of application No. PCT/JP2015/077032, filed on Sep. 25, 2015.

(30) Foreign Application Priority Data

Sep. 29, 2014  (JP) ................ 2014-198304

(51) Int. Cl.
  *C09J 7/00*   (2018.01)
  *C09J 11/06*   (2006.01)
  (Continued)

(52) U.S. Cl.
  CPC .......... *C09J 11/06* (2013.01); *B32B 3/08* (2013.01); *B32B 7/04* (2013.01); *B32B 7/06* (2013.01); *B32B 7/12* (2013.01); *B32B 9/043* (2013.01); *B32B 15/06* (2013.01); *B32B 25/04* (2013.01); *B32B 25/08* (2013.01); *B32B 25/12* (2013.01); *B32B 25/14* (2013.01); *B32B 25/16* (2013.01); *B32B 25/18* (2013.01); *B32B 25/20* (2013.01); *B32B 27/06* (2013.01); *B32B 27/08* (2013.01); *B32B 27/20* (2013.01); *B32B 27/26* (2013.01); *B32B 27/28* (2013.01); *B32B 27/285* (2013.01); *B32B 27/286* (2013.01); *B32B 27/304* (2013.01); *B32B 27/306* (2013.01); *B32B 27/325* (2013.01); *B32B 27/34* (2013.01); *B32B 27/36* (2013.01); *B32B 27/365* (2013.01); *B32B 27/38* (2013.01); *B32B 27/42* (2013.01); *C08J 3/092* (2013.01); *C09J 7/00* (2013.01); *C09J 7/10* (2018.01); *C09J 121/00* (2013.01); *C09J 153/025* (2013.01); *H01L 21/02* (2013.01); *H01L 21/6836* (2013.01); *B32B 2250/03* (2013.01); *B32B 2255/10* (2013.01); *B32B 2255/26* (2013.01); *B32B 2270/00* (2013.01); *B32B 2307/30* (2013.01); *B32B 2307/306* (2013.01); *B32B 2307/51* (2013.01); *B32B 2307/58* (2013.01); *B32B 2307/584* (2013.01); *B32B 2307/732* (2013.01); *B32B 2307/748* (2013.01); *B32B 2457/14* (2013.01);
(Continued)

(58) Field of Classification Search
CPC . C09J 11/06; C09J 7/00; C09J 153/025; C09J 7/10; C09J 3/092; C09J 121/00; B32B 7/12
USPC ........................................... 524/855
See application file for complete search history.

(56) References Cited

U.S. PATENT DOCUMENTS

2011/0195248 A1* 8/2011 Kiuchi ............... B32B 7/12
  428/339
2012/0171362 A1* 7/2012 Kim .................. C09J 163/00
  427/98.5
(Continued)

FOREIGN PATENT DOCUMENTS

JP   51-121059 A   10/1976
JP   11-117180 A   4/1999
(Continued)

OTHER PUBLICATIONS

Machine Translation of JP 2014-037458 (Year: 2014).*
(Continued)

*Primary Examiner* — Hannah J Pak
(74) *Attorney, Agent, or Firm* — Sughrue Mion, PLLC

(57) ABSTRACT

Provided are a composition which has good elastomer solubility, is thus capable of increasing a concentration of solid contents, and is capable of forming a film having excellent drying properties, surface morphology, and heat resistance, a process for producing a sheet, a sheet, a laminate, and a laminate with a device wafer. This composition includes an elastomer having a 5% thermal mass reduction temperature of 375° C. or higher when heated at an elevation rate of 20° C./min from 25° C., a solvent represented by the following General Formula (1) and having a boiling point of 160° C. or higher, and a solvent having a boiling point of lower than 120° C. In General Formula (1), $R^1$ to $R^6$ each independently represent a hydrogen atom or an aliphatic hydrocarbon group.

(1)

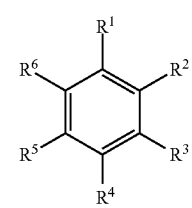

19 Claims, 1 Drawing Sheet

(51) Int. Cl.

| | | |
|---|---|---|
| *C09J 121/00* | (2006.01) | |
| *H01L 21/02* | (2006.01) | |
| *B32B 7/12* | (2006.01) | |
| *B32B 25/04* | (2006.01) | |
| *C09J 153/02* | (2006.01) | |
| *H01L 21/683* | (2006.01) | |
| *C08J 3/09* | (2006.01) | |
| *C09J 7/10* | (2018.01) | |
| *B32B 7/04* | (2019.01) | |
| *B32B 7/06* | (2019.01) | |
| *B32B 9/04* | (2006.01) | |
| *B32B 15/06* | (2006.01) | |
| *B32B 25/12* | (2006.01) | |
| *B32B 25/14* | (2006.01) | |
| *B32B 25/16* | (2006.01) | |
| *B32B 25/18* | (2006.01) | |
| *B32B 25/20* | (2006.01) | |
| *B32B 27/06* | (2006.01) | |
| *B32B 27/08* | (2006.01) | |
| *B32B 27/36* | (2006.01) | |
| *B32B 25/08* | (2006.01) | |
| *B32B 27/20* | (2006.01) | |
| *B32B 27/26* | (2006.01) | |
| *B32B 27/28* | (2006.01) | |
| *B32B 27/30* | (2006.01) | |
| *B32B 27/32* | (2006.01) | |
| *B32B 27/34* | (2006.01) | |
| *B32B 27/38* | (2006.01) | |
| *B32B 27/42* | (2006.01) | |
| *B32B 3/08* | (2006.01) | |
| *C08J 5/18* | (2006.01) | |

(52) U.S. Cl.
CPC .............. *C08J 5/18* (2013.01); *C08J 2309/06* (2013.01); *C08J 2353/02* (2013.01); *C09J 2201/622* (2013.01); *C09J 2203/326* (2013.01); *C09J 2453/00* (2013.01); *H01L 2221/6834* (2013.01); *H01L 2221/68327* (2013.01); *H01L 2221/68386* (2013.01)

(56) References Cited

U.S. PATENT DOCUMENTS

| | | | |
|---|---|---|---|
| 2012/0270968 A1* | 10/2012 | Mao | C09D 5/08 523/442 |
| 2014/0154868 A1 | 6/2014 | Sugo et al. | |
| 2014/0255638 A1 | 9/2014 | Imai et al. | |
| 2018/0016471 A1* | 1/2018 | Kamochi | C09J 7/00 |

FOREIGN PATENT DOCUMENTS

| | | |
|---|---|---|
| JP | 2014-037458 A | 2/2014 |
| JP | 2014-131004 A | 7/2014 |
| TW | 201331316 A1 | 8/2013 |
| WO | 2013/065417 A1 | 5/2013 |

OTHER PUBLICATIONS

International Search Report for PCT/JP2015/077032, dated Dec. 15, 2015. [PCT/ISA/210].

Written Opinion for PCT/JP2015/077032, dated Dec. 15, 2015. [PCT/ISA/237].

Office Action dated Jul. 17, 2018, issued by the State Intellectual Property Office of the P.R.C. in corresponding Chinese Application No. 201580052955.4.

Office Action dated Mar. 13, 2018 issued by the Intellectual Property Office of People's Republic China in counterpart Chinese Application No. 201580052955.4.

Office Action dated Jan. 16, 2018 from the Japanese Patent Office in counterpart Japanese Application No. 2016-551964.

Office Action dated Apr. 3, 2018 issued by the Korean Intellectual Property Office in counterpart Korean Application No. 10-2017-7008263.

International Preliminary Report on Patentability issued from the International Bureau in counterpart International Application No. PCT/JP2015/077032, dated Apr. 13, 2017.

Office Action dated Jan. 7, 2019, from the State Intellectual Property Office of People's Republic of China in counterpart Chinese Application No. 201580052955.4.

Office Action dated Feb. 15, 2019 from the Taiwanese Patent Office in Taiwanese Application No. 104131521.

* cited by examiner

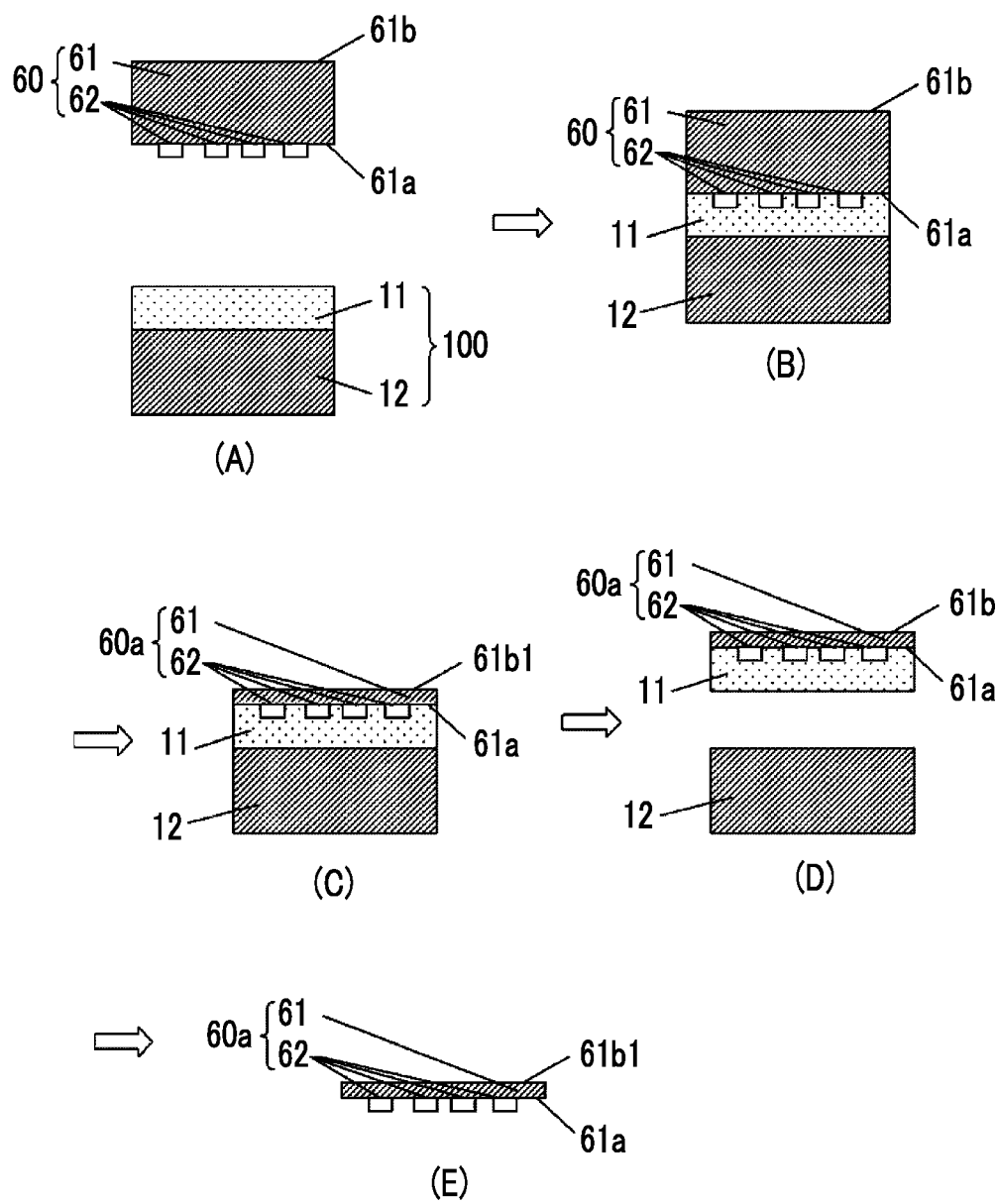

COMPOSITION, PROCESS FOR PRODUCING SHEET, SHEET, LAMINATE, AND LAMINATE WITH DEVICE WAFER

CROSS-REFERENCE TO RELATED APPLICATIONS

This application is a Continuation of PCT International Application No. PCT/JP2015/077032 filed on Sep. 25, 2015, which claims priority under 35 U.S.C. § 119(a) to Japanese Patent Application No. 2014-198304 filed on Sep. 29, 2014. Each of the above application(s) is hereby expressly incorporated by reference, in its entirety, into the present application.

BACKGROUND OF THE INVENTION

1. Field of the Invention

The present invention relates to a composition, a process for producing a sheet, a sheet, a laminate, and a laminate with a device wafer. More specifically, the present invention relates to a composition, a process for producing a sheet, a sheet, a laminate, and a laminate with a device wafer, each of which can be preferably used in the production of a semiconductor device or the like.

2. Description of the Related Art

In the production process of a semiconductor device such as an integrated circuit (IC) or a large-scale integrated circuit (LSI), a large number of IC chips are formed on a device wafer and individualized by dicing.

With the needs for further miniaturization and higher performance of electronic devices, there is a demand for further miniaturization and higher integration of IC chips mounted on electronic devices, but the high integration of an integrated circuit in the plane direction of a device wafer is close to the limit.

As a method for an electrical connection of an integrated circuit in an IC chip to an external terminal of the IC chip, a wire bonding method has been heretofore widely known. In order to miniaturize the IC chip, in recent years, a method in which a through hole is provided in a device wafer and a metal plug as the external terminal is connected to the integrated circuit so as to pass through the through hole (a method for forming so-called through-silicon via (TSV)) has become known. However, with the method for forming a through-silicon via alone, the needs of higher integration for the IC chip in recent years as described above have not been sufficiently fulfilled.

In consideration of these things, there is known a technique of improving the integration density per unit area of the device wafer by making the integrated circuit in an IC chip multi-layered. However, since a multi-layered integrated circuit increases the thickness of the IC chip, reduction in the thickness of members constituting the IC chip is required. As to the reduction in the thickness of the members, for example, reduction in the thickness of the device wafer has been studied and is promising not only to lead to the miniaturization of an IC chip but also to save labor in a through-hole producing step of the device wafer in the production of the through-silicon via. Further, a thickness reduction has also been attempted in semiconductor devices such as a power device and an image sensor, from the viewpoint of improving the integration density and improving the flexibility of device structures.

A wafer having a thickness of approximately 700 to 900 µm is widely known as the device wafer. In recent years, for the purpose of miniaturization of an IC chip, it has been attempted to reduce the thickness of a device wafer to 200 µm or less.

However, a device wafer having a thickness of 200 µm or less is very thin and thus, a member for producing a semiconductor device using such a device wafer as a base material is also very thin, and therefore, in a case, for example, where the member is subjected to an additional treatment or where the member is simply moved, it is difficult to support the member stably while not damaging the member.

In order to solve the problems as described above, there is known a technique in which a device wafer before reducing the thickness thereof is temporarily fixed (temporarily bonded) to a support substrate with a temporary bonding material, a rear surface of the device wafer is ground to make it thin, and then the support substrate is dissociated from the device wafer.

JP2014-37458A discloses the attachment of a wafer to a support substrate of the wafer using an adhesive film which has an adhesive layer formed using an adhesive composition containing a styrene-based elastomer, ethyl acetate, and decahydronaphthalene.

On the other hand, JP 1999-117180A (JP-H11-117180A) discloses the production of a sheet-like material in which a fibrous base material is impregnated with a styrene-based elastomer dispersion solution containing 150 to 2,400 parts by weight of an organic solvent, 100 to 1,500 parts by weight of water and 1 to 20 parts by weight of a nonionic surfactant having a Hydrophile-Lipophile Balance (HLB) value of 6 to 17 with respect to 100 parts by weight of the styrene-based elastomer, and then dried.

SUMMARY OF THE INVENTION

In a case where a surface of a device wafer is temporarily bonded to a support substrate, in order to stably support the device wafer, a certain level of adhesive strength is required in the temporary bonding layer between the device wafer surface and the support substrate and properties capable of easily releasing the temporary bonding state of the device wafer and the support substrate are required. In forming a temporary bonding layer satisfying such properties, it has been studied to use an elastomer.

Further, in a case where a device wafer is temporarily bonded to a support substrate using a sheet, it is preferred that the sheet has a certain degree of thickness for ensuring the followability to the surface shapes of the device wafer (for example, structures such as metal bumps, pads, and vias).

However, the present inventors have examined the composition disclosed in JP2014-37458A and found that the composition of JP2014-37458A has a low elastomer solubility and exhibits a difficulty in forming a thick sheet. In addition, it has also been found that the composition of JP2014-37458A has poor drying properties, so there is a tendency to increase the residual amount of a solvent in the film.

Although it is conceivable to use a low-boiling point solvent as a method to improve the drying properties of the composition, it has been found that the use of a low-boiling point solvent is likely to result in the occurrence of drying unevenness and thickness unevenness and the tendency of deterioration in surface morphology of the film surface. When surface morphology of the film surface is inferior, there is a tendency that adhesiveness to a device wafer or support substrate is poor.

In the production process of a device, in recent years, the device may be subjected to a treatment at a higher temperature. Therefore, in order to cope with various production processes, a further improvement in heat resistance is required also in the temporary bonding film.

On the other hand, JP1999-117180A (JP-H11-117180A) discloses a sheet having a texture of natural leather which has been obtained by impregnating a fibrous base material with a styrene-based elastomer dispersion solution and drying it. That is, JP1999-117180A (JP-H11-117180A) uses the styrene-based elastomer dispersion solution as a binding agent of the fibrous base material. However, in JP1999-117180A (JP-H11-117180A), there is no description on the formation of a sheet or the like using a styrene-based elastomer dispersion solution. Furthermore, there is no description on increasing of elastomer solubility, surface morphology after drying, and heat resistance.

The present invention has been made in consideration of the above background, and an object of the present invention is to provide a composition which has good elastomer solubility, is thus capable of increasing a concentration of solid contents, and is capable of forming a film having excellent drying properties, surface morphology, and heat resistance, a process for producing a sheet, a sheet, a laminate, and a laminate with a device wafer.

The present inventors have made intensive studies to solve the above-mentioned problems, and as a result, have found that the foregoing object is achieved by using an elastomer having a 5% thermal mass reduction temperature of 375° C. or higher when heated at an elevation rate of 20° C./min from 25° C.; a solvent represented by General Formula (1) to be described hereinafter and having a boiling point of 160° C. or higher; and a solvent having a boiling point of lower than 120° C. in combination. The present invention has been completed based on such a finding. The present invention provides the following.

<1> A composition comprising: an elastomer having a 5% thermal mass reduction temperature of 375° C. or higher when heated at an elevation rate of 20° C./min from 25° C.; a solvent represented by the following General Formula (1) and having a boiling point of 160° C. or higher; and a solvent having a boiling point of lower than 120° C.,

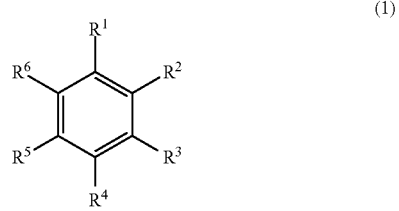

(1)

in General Formula (1), $R^1$ to $R^6$ each independently represent a hydrogen atom or an aliphatic hydrocarbon group.

<2> The composition according to <1>, in which the content of the elastomer in the composition is 25 mass % or more.

<3> The composition according to <1> or <2>, in which the elastomer is an elastomer containing a styrene-derived repeating unit.

<4> The composition according to any one of <1> to <3>, in which the elastomer is a hydrogenated product.

<5> The composition according to any one of <1> to <4>, in which the elastomer is a styrene block polymer whose one terminal or both terminals are a styrene block.

<6> The composition according to any one of <1> to <5>, in which the elastomer has a styrene content of 40 mass % or more.

<7> The composition according to any one of <1> to <6>, in which the solvent having a boiling point of 160° C. or higher has a SP value of 19 $(MPa)^{1/2}$ or less.

<8> The composition according to any one of <1> to <7>, in which the solvent having a boiling point of lower than 120° C. has a SP value of 19 $(MPa)^{1/2}$ or less.

<9> The composition according to any one of <1> to <8>, in which the solvent having a boiling point of lower than 120° C. is one or more selected from an aromatic hydrocarbon, an alicyclic hydrocarbon, and a cyclic ether.

<10> The composition according to any one of <1> to <9>, in which the content of the solvent having a boiling point of lower than 120° C. in the composition is 10 to 60 mass %.

<11> The composition according to any one of <1> to <10>, in which the mass ratio of the solvent having a boiling point of 160° C. or higher to the solvent having a boiling point of lower than 120° C. is 80:20 to 99:1.

<12> The composition according to any one of <1> to <11>, further comprising an antioxidant.

<13> The composition according to <12>, in which the content of the antioxidant in the composition is 1 to 7 mass %.

<14> The composition according to any one of <1> to <13>, which is for the formation of a sheet.

<15> The composition according to any one of <1> to <14>, which is a temporary fixing adhesive composition.

<16> A process for producing a sheet, comprising: applying the composition according to any one of <1> to <15> onto a support; and drying the applied composition.

<17> A sheet obtained by drying the composition according to any one of <1> to <15>.

<18> A laminate comprising a sheet obtained by drying the composition according to any one of claims 1 to 15; and a support having releasability which is provided on one or both sides of the sheet.

<19> A laminate with a device wafer, comprising a sheet obtained by drying the composition according to any one of <1> to <15> between a device wafer and a support substrate, in which one surface of the sheet is in contact with the device surface of the device wafer, and the other surface of the sheet is in contact with the surface of the support substrate.

According to the present invention, it has become possible to provide a composition which has good elastomer solubility, is thus capable of increasing a concentration of solid contents, and is capable of forming a film having excellent drying properties, surface morphology, and heat resistance, a process for producing a sheet, a sheet, a laminate, and a laminate with a device wafer.

BRIEF DESCRIPTION OF THE DRAWINGS

FIG. 1 is a schematic diagram of one embodiment illustrating a method of producing a semiconductor device.

DESCRIPTION OF THE PREFERRED EMBODIMENTS

Hereinafter, embodiments of the present invention will be described in detail.

In the present specification, notation of a group (atomic group) without being preceded by "substituted" or "unsubstituted" is used to encompass not only a group having no substituent, but also a group having a substituent. For example, an "alkyl group" encompasses not only an alkyl group having no substituent (unsubstituted alkyl group), but also an alkyl group having a substituent (substituted alkyl group).

In the present specification, the term "actinic rays" or "radiation" means to encompass, for example, visible rays, ultraviolet rays, far ultraviolet rays, electron beams, X-rays, and the like.

In the present specification, the term "light" means actinic rays or radiation.

In the present specification, unless otherwise indicated, the term "exposure" encompasses not only exposure to a mercury lamp, ultraviolet rays, far ultraviolet rays typified by excimer laser, X-rays, extreme ultraviolet (EUV) rays or the like, but also lithography with particle beams such as electron beams and ion beams.

In the present specification, the term "(meth)acrylate" means acrylate and methacrylate, the term "(meth)acrylic" means acrylic and methacrylic, and the term "(meth)acryloyl" means "acryloyl" and "methacryloyl".

In the present specification, a weight-average molecular weight and a number-average molecular weight are defined as a value obtained by gel permeation chromatography (GPC) measurement in terms of polystyrene. In the present specification, the weight-average molecular weight (Mw) and the number-average molecular weight (Mn) may be determined, for example, using an HLC-8220 (manufactured by Tosoh Corporation), and a TSKgel Super AWM-H (6.0 mm ID×15.0 cm, manufactured by Tosoh Corporation) as a column. The measurement is carried out using a 10 mmol/L lithium bromide N-methylpyrrolidinone (NMP) solution as an eluent.

The solid content in the present specification indicates a solid content at 25° C.

Incidentally, in the embodiments described below, the member and the like described in the drawings already referred to are indicated by the same or like symbols in the FIGURE and their description is simplified or omitted.

<Composition>

The composition of the present invention contains (A) an elastomer having a 5% thermal mass reduction temperature of 375° C. or higher when heated at an elevation rate of 20° C./min from 25° C., (B) a solvent represented by General Formula (1) to be described hereinafter and having a boiling point of 160° C. or higher, and (C) a solvent having a boiling point of lower than 120° C.

Owing to incorporation of an elastomer having a mass reduction rate of 5 mass % or less at 375° C. when heated at an elevation rate of 20° C./min from 25° C., the composition of the present invention is capable of forming a film, such as a sheet, having excellent heat resistance. Thus, for example, a device wafer can be stably and temporarily bonded even in a case of being subjected to processes at a high temperature.

Further, incorporation of a solvent represented by General Formula (1) to be described hereinafter and having a boiling point of 160° C. or higher can result in an increased solubility of the elastomer and an increased concentration of solid contents of the composition. For this reason, it is possible to easily produce a thick film such as a sheet. In particular, in a case where an elastomer containing a styrene-derived repeating unit is used as the elastomer, it is possible to further increase the solubility of the elastomer.

By using (B) a solvent represented by General Formula (1) to be described hereinafter and having a boiling point of 160° C. or higher and (C) a solvent having a boiling point of lower than 120° C. in combination, it is possible to produce a film, such as a sheet, having excellent surface morphology while increasing drying properties of the composition.

In a case where (B) a solvent represented by General Formula (1) to be described hereinafter and having a boiling point of 160° C. or higher is used alone, the remaining amount of the solvent in the film tends to be higher because the drying rate of the composition is low. Incidentally, in a case where (C) a solvent having a boiling point of lower than 120° C. is used alone, the solubility of the elastomer is insufficient, and therefore it is difficult to produce a thick film. Furthermore, since the drying rate of the composition is too high, drying unevenness and thickness unevenness are likely to occur and surface morphology is likely to be inferior.

The composition of the present invention can be preferably used for the formation of a sheet.

In addition, the composition of the present invention can be preferably used as a temporary fixing adhesive composition.

Hereinafter, individual components in the composition of the present invention will be described in detail.

<<(A) Elastomer>>

The composition of the present invention contains an elastomer. By incorporation of an elastomer, it is possible to form a film, such as a sheet, which follows fine irregularities of a support substrate or a device wafer and has excellent adhesiveness due to appropriate anchor effects. Further, when peeling a support substrate from a device wafer, it is possible to easily peel the support substrate from the device wafer without applying stress to the device wafer or the like, thereby capable of preventing damage or peeling of a device or the like on the device wafer.

In the present specification, the term "elastomer" refers to a polymer compound exhibiting elastic deformation. That is, the elastomer is defined as a polymer compound having properties that deform instantaneously in response to an external force when the external force is applied and recover the original shape in a short time when the external force is released.

In the present invention, it is preferred that the elastomer have properties that can be deformed up to 200% with a small external force at room temperature (20° C.) when the original size is taken as 100%, and return to 130% or less in a short time at the time of releasing the external force.

In the present invention, the elastomer has a 5% thermal mass reduction temperature of 375° C. or higher when heated at an elevation rate of 20° C./min from 25° C., preferably 380° C. or higher, more preferably 390° C. or higher, and most preferably 400° C. or higher. In addition, the upper limit value is not particularly limited. For example, the upper limit value is preferably 1,000° C. or lower and more preferably 800° C. or lower. According to this aspect, it is easy to form a film, such as a sheet, having excellent heat resistance. The thermal mass reduction temperature is a value measured by a thermogravimetric analyzer (TGA) under a nitrogen stream and in the above-mentioned temperature elevation conditions. In a case where the composition of the present invention contains two or more elastomers, such a temperature refers to a value in a mixture of two or more elastomers.

In the present invention, the glass transition temperature (hereinafter, also referred to as "Tg") of the elastomer is preferably −50° C. to 300° C. and more preferably 0° C. to 200° C. When Tg is within the above-specified range, it is possible to form a film, such as a sheet, having good followability to the device wafer surface during adhesion and having no voids. In a case where the elastomer has two or more points of Tg, the above-mentioned value of Tg refers to a lower glass transition temperature.

In the present invention, the weight-average molecular weight of the elastomer is preferably 2,000 to 200,000, more preferably 10,000 to 200,000, and particularly preferably 50,000 to 100,000. When the weight-average molecular weight of the elastomer is within this range, there is an advantage that no residue remains on a device wafer and a support substrate since the solubility in a solvent is excellent even when peeling of the support substrate from the device wafer and then removing the residues derived from the elastomer remaining on the device wafer and/or the support substrate.

Examples of the elastomer that can be used in the present invention include an elastomer containing a styrene-derived repeating unit (polystyrene-based elastomer), a polyester-based elastomer, a polyolefin-based elastomer, a polyurethane-based elastomer, a polyamide-based elastomer, a polyacrylic elastomer, a silicone-based elastomer, and a polyimide-based elastomer. Preferred is one or more selected from a polystyrene-based elastomer, a polyester-based elastomer, a polyolefin-based elastomer, a polyurethane-based elastomer, a polyamide-based elastomer, a polyacrylic elastomer, a silicone-based elastomer and a polyimide-based elastomer and particularly preferred is a polystyrene-based elastomer from the viewpoint of solubility and heat resistance.

Further, the elastomer is preferably a hydrogenated product. In particular, the elastomer is preferably a hydrogenated product of a polystyrene-based elastomer. When the elastomer is a hydrogenated product, it is easy to form a film, such as a sheet, having excellent heat resistance. Furthermore, it is easy to form a film, such as a sheet, having excellent peelability and cleaning and removing properties after peeling. The above-mentioned effect is significant in a case where a hydrogenated product of a polystyrene-based elastomer is used. Note that the hydrogenated product refers to a polymer of a structure in which the elastomer is hydrogenated.

<<<Polystyrene-Based Elastomer>>>

In the present invention, the polystyrene-based elastomer is not particularly limited and may be appropriately selected depending on the purpose. Examples of the polystyrene-based elastomer include a styrene-butadiene-styrene block copolymer (SBS), a styrene-isoprene-styrene block copolymer (SIS), a styrene-ethylene-butylene-styrene block copolymer (SEBS), a styrene-butadiene-butylene-styrene copolymer (SBBS) and hydrogenated products thereof, a styrene-ethylene-propylene-styrene block copolymer (SEPS), and a styrene-ethylene-ethylene-propylene-styrene block copolymer.

In the polystyrene-based elastomer, the content of the styrene-derived repeating unit is preferably 40 mass % or more, more preferably 45 mass % or more, and still more preferably 46 mass % or more. The upper limit may be, for example, 90 mass % or less, or may also be 85 mass % or less.

The polystyrene-based elastomer is preferably a block copolymer of styrene and other monomers, more preferably a block copolymer whose one terminal or both terminals are a styrene block, and particularly preferably a block copolymer whose both terminals are a styrene block. When both terminals of the polystyrene-based elastomer are a styrene block (styrene-derived repeating unit), there is a tendency that heat resistance is further improved. This is because the styrene-derived repeating unit having high heat resistance is present at the terminal. In particular, it is preferred that when the styrene block (block portion of the styrene-derived repeating unit) is a reactive polystyrene-based hard block, heat resistance and chemical resistance tend to be superior. Further, it is believed that, by using the elastomer which is a block copolymer, phase separation at the hard block and soft block is carried out at 200° C. or higher. The shape of the phase separation is believed to contribute to the suppression of occurrence of unevenness on the substrate surface of a device wafer. Additionally, such an elastomer is more preferable from the viewpoint of solubility in a solvent and resistance to a resist solvent.

In addition, when the polystyrene-based elastomer is a hydrogenated product, stability against heat is improved, and deterioration such as decomposition or polymerization is unlikely to occur. Further, such a hydrogenated product is more preferable from the viewpoint of solubility in a solvent and resistance to a resist solvent.

In the present specification, the "styrene-derived repeating unit" is a constitutional unit derived from styrene, which is contained in the polymer upon polymerization of styrene or a styrene derivative, and may have a substituent. Examples of the styrene derivative include α-methyl styrene, 3-methyl styrene, 4-propyl styrene, and 4-cyclohexyl styrene. Examples of the substituent include an alkyl group having 1 to 5 carbon atoms, an alkoxy group having 1 to 5 carbon atoms, an alkoxyalkyl group having 1 to 5 carbon atoms, an acetoxy group, and a carboxyl group.

Examples of commercially available polystyrene-based elastomers include TUFPRENE A, TUFPRENE 125, TUFPRENE 126S, SOLPRENE T, ASAPRENE T-411, ASAPRENE T-432, ASAPRENE T-437, ASAPRENE T-438, ASAPRENE T-439, TUFTEC H1272, TUFTEC P1500, TUFTEC P5051, TUFTEC H1052, TUFTEC H1062, TUFTEC M1943, TUFTEC M1911, TUFTEC H1041, TUFTEC MP10, TUFTEC M1913, TUFTEC H1051, TUFTEC H1053, TUFTEC P2000, and TUFTEC 111043 (all manufactured by Asahi Kasei Corporation), ELASTOMER AR-850C, ELASTOMER AR-815C, ELASTOMER AR-840C, ELASTOMER AR-830C, ELASTOMER AR-860C, ELASTOMER AR-875C, ELASTOMER AR-885C, ELASTOMER AR-SC-15, ELASTOMER AR-SC-0, ELASTOMER AR-SC-5, ELASTOMER AR-710, ELASTOMER AR-SC-65, ELASTOMER AR-SC-30, ELASTOMER AR-SC-75, ELASTOMER AR-SC-45, ELASTOMER AR-720, ELASTOMER AR-741, ELASTOMER AR-731, ELASTOMER AR-750, ELASTOMER AR-760, ELASTOMER AR-770, ELASTOMER AR-781, ELASTOMER AR-791, ELASTOMER AR-FL-75N, ELASTOMER AR-FL-85N, ELASTOMER AR-FL-60N, ELASTOMER AR-1050, ELASTOMER AR-1060, and ELASTOMER AR-1040 (manufactured by Aronkasei Co., Ltd.), CLAYTON D1111, CLAYTON D1113, CLAYTON D1114, CLAYTON D1117, CLAYTON D1119, CLAYTON D1124, CLAYTON D1126, CLAYTON D1161, CLAYTON D1162, CLAYTON D1163, CLAYTON D1164, CLAYTON D1165, CLAYTON D1183, CLAYTON D1193, CLAYTON DX406, CLAYTON D4141, CLAYTON D4150, CLAYTON D4153, CLAYTON D4158, CLAYTON D4270, CLAYTON D4271, CLAYTON D4433, CLAYTON D1170, CLAYTON D1171, CLAYTON D1173, CARIFLEX IR0307, CARIFLEX IR0310, CARIFLEX IR0401, CLAYTON D0242, CLAYTON D1101, CLAYTON D1102, CLAYTON D1116, CLAYTON D1118, CLAYTON D1133, CLAYTON D1152, CLAYTON D1153, CLAYTON D1155, CLAYTON D1184, CLAYTON D1186, CLAYTON D1189, CLAYTON D1191, CLAYTON D1192, CLAYTON DX405, CLAYTON DX408, CLAYTON DX410, CLAYTON DX414, CLAYTON DX415, CLAYTON A1535, CLAYTON A1536, CLAYTON FG1901, CLAYTON FG1924, CLAYTON G1640, CLAYTON G1641, CLAYTON G1642, CLAYTON G1643, CLAYTON G1645, CLAYTON G1633, CLAYTON G1650, CLAYTON G1651, CLAYTON G1652, CLAYTON G1654, CLAYTON G1657, CLAYTON G1660, CLAYTON G1726, CLAYTON G1701, CLAYTON G1702, CLAYTON G1730, CLAYTON G1750, CLAYTON G1765, CLAYTON G4609, and CLAYTON G4610 (manufactured by Kraton Corporation), TR2000, TR2001, TR2003, TR2250, TR2500, TR2601, TR2630, TR2787, TR2827, TR1086, TR1600, SIS5002, SIS5200, SIS5250, SIS5405, SIS5505, DYNARON 6100P, DYNARON 4600P, DYNARON 6200P, DYNARON 4630P, DYNARON 8601P, DYNARON 8630P, DYNARON 8600P, DYNARON 8903P, DYNARON 6201B, DYNARON 1321P, DYNARON 1320P, DYNARON 2324P, and DYNARON 9901P (manufactured by JSR Corporation), DENKA STR series (manufactured by Denki Kagaku Kogyo Co., Ltd.), QUINTAC 3520, QUINTAC 3433N, QUINTAC 3421, QUINTAC 3620, QUINTAC 3450, and QUINTAC 3460 (manufactured by Zeon Corporation), TPE-SB series (manufactured by Sumitomo Chemical Co., Ltd.), RABALON series (manufactured by Mitsubishi Chemical Corporation), SEPTON S1001, SEPTON S8004, SEPTON S4033, SEPTON S2104, SEPTON S8007, SEPTON S2007, SEPTON S2004, SEPTON S2063, SEPTON HG252, SEPTON S8076, SEPTON S2002, SEPTON S1020, SEPTON S8104, SEPTON S2005, SEPTON S2006, SEPTON S4055, SEPTON S4044, SEPTON S4077, SEPTON S4099, SEPTON S8006, SEPTON V9461, HYBRAR 7311, HYBRAR 7125, HYBRAR 5127, and HYBRAR 5125 (all manufactured by Kuraray Co., Ltd.), SUMIFLEX (manufactured by Sumitomo Bakelite Co., Ltd.), and REOSUTOMA and ACTIMER (all manufactured by Riken Vinyl Industry Co., Ltd.).

<<<Polyester-Based Elastomer>>>

The polyester-based elastomer is not particularly limited and may be appropriately selected depending on the purpose. Examples of the polyester-based elastomer include those obtained by polycondensation of a dicarboxylic acid or a derivative thereof with a diol compound or a derivative thereof.

Examples of the dicarboxylic acid include aromatic dicarboxylic acids such as terephthalic acid, isophthalic acid, and naphthalene dicarboxylic acid and aromatic dicarboxylic acids in which hydrogen atoms of aromatic nuclei of the foregoing aromatic dicarboxylic acids are substituted with a methyl group, an ethyl group, a phenyl group or the like, aliphatic dicarboxylic acids having 2 to 20 carbon atoms such as adipic acid, sebacic acid, and dodecane dicarboxylic acid, and alicyclic dicarboxylic acids such as cyclohexane dicarboxylic acid. These compounds may be used alone or in combination of two or more thereof.

Examples of the diol compound include aliphatic diols such as ethylene glycol, 1,3-propanediol, 1,4-butanediol, 1,6-hexanediol, 1,10-decanediol, and 1,4-cyclohexanediol, alicyclic diols, and divalent phenols represented by the following structural formula.

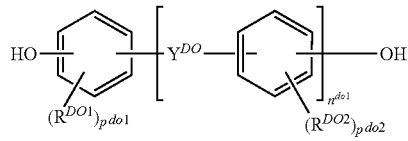

In the above formula, $Y^{DO}$ represents any one of an alkylene group having 1 to 10 carbon atoms, a cycloalkylene group having 4 to 8 carbon atoms, —O—, —S—, and —SO$_2$— or represents a direct bond (single bond) of benzene rings. $R^{DO1}$ and $R^{DO2}$ each independently represent a halogen atom or an alkyl group having 1 to 12 carbon atoms. $p^{do1}$ and $p^{do2}$ each independently represent an integer of 0 to 4, and $n^{do1}$ represents 0 or 1.

Specific examples of the polyester-based elastomer include bisphenol A, bis-(4-hydroxyphenyl)methane, bis-(4-hydroxy-3-methylphenyl)propane, and resorcin. These compounds may be used alone or in combination of two or more thereof.

Further, as the polyester-based elastomer, it is also possible to use a multiblock copolymer which has an aromatic polyester (for example, polybutylene terephthalate) portion as a hard segment component and an aliphatic polyester (for example, polytetramethylene glycol) portion as a soft segment component. Examples of the multiblock copolymer include those of various grades depending on the kind, ratio, and molecular weight difference of hard segments and soft segments. Specific examples of the multiblock copolymer include HYTREL (manufactured by Du Pont-Toray Co., Ltd.), PELPRENE (manufactured by Toyobo Co., Ltd.), PRIMALLOY (manufactured by Mitsubishi Chemical Corporation), NUBERAN (manufactured by Teijin Chemicals Ltd.), ESPER 1612 and 1620 (Hitachi Chemical Co., Ltd.), and PRIMALLOY CP300 (manufactured by Mitsubishi Chemical Corporation).

<<<Polyolefin-Based Elastomer>>>

The polyolefin-based elastomer is not particularly limited and may be appropriately selected depending on the purpose. Examples of the polyolefin-based elastomer include copolymers of α-olefins having 2 to 20 carbon atoms such as ethylene, propylene, 1-butene, 1-hexene, and 4-methylpentene. Examples of such copolymers include an ethylene-propylene copolymer (EPR) and an ethylene-propylene-diene copolymer (EPDM). Further examples thereof include copolymers of non-conjugated dienes having 2 to 20 carbon atoms, such as dicyclopentadiene, 1,4-hexadiene, cyclooctadiene, methylene norbornene, ethylidene norbornene, butadiene, and isoprene, with α-olefins. Further, mention may be made of a carboxy-modified nitrile rubber obtained by copolymerizing a butadiene-acrylonitrile copolymer with methacrylic acid. Specific examples of the carboxy-modified nitrile rubber include an ethylene/α-olefin copolymer rubber, an ethylene/α-olefin/non-conjugated diene copolymer rubber, a propylene/α-olefin copolymer rubber, and a butene/α-olefin copolymer rubber.

Examples of commercially available polyolefin-based elastomer include MILASTOMER (manufactured by Mitsui Chemicals Co., Ltd.), THERMORUN (manufactured by Mitsubishi Chemical Corporation), EXACT (manufactured by Exxon Chemical Company), ENGAGE (Dow Chemical), ESPOLEX (manufactured by Sumitomo Chemical Co., Ltd.), Sarlink (manufactured by Toyobo Co., Ltd.), NEW-CON (manufactured by Japan Polypropylene Corporation), and EXCELINK (manufactured by JSR Corporation).

<<<Polyurethane-Based Elastomer>>>

The polyurethane-based elastomer is not particularly limited and may be appropriately selected depending on the purpose. Examples of the polyurethane-based elastomer include elastomers containing structural units of a hard segment composed of a low molecular weight glycol and a diisocyanate and a soft segment composed of a polymer (long chain) diol and a diisocyanate.

Examples of the polymer (long chain) diol include polypropylene glycol, polytetramethylene oxide, poly(1,4-butylene adipate), poly(ethylene-1,4-butylene adipate), polycaprolactone, poly(1,6-hexylene carbonate), and poly(1,6-hexylene-neopentylene adipate). The number-average molecular weight of the polymer (long chain) diol is preferably 500 to 10,000.

Examples of the low molecular weight glycol that can be used include short chain diols such as ethylene glycol, propylene glycol, 1,4-butanediol, and bisphenol A. The number-average molecular weight of the short chain diol is preferably 48 to 500. Examples of commercially available polyurethane-based elastomer include PANDEX T-2185 and T-2983N (manufactured by DIC Corporation), MIRACTRAN (manufactured by Nippon Miractran Co., Ltd.), ELASTOLLAN (manufactured by BASF Corporation), RESAMIN (manufactured by Dainichiseika Color & Chemicals Mfg. Co., Ltd.), PELLETHANE (manufactured by Dow Chemical Company), IRON RUBBER (NOK Corporation), and MOBILON (Nisshinbo Chemical Inc.).

<<<Polyamide-Based Elastomer>>>

The polyamide-based elastomer is not particularly limited and may be appropriately selected depending on the purpose. Examples of the polyamide-based elastomer include elastomers in which polyamides such as polyamide-6, 11, and 12 are used in the hard segment, and polyethers and/or polyesters such as polyoxyethylene, polyoxypropylene, and polytetramethylene glycol are used in the soft segment. Such elastomers are classified roughly into two types of polyether block amide type and polyetherester block amide type. Examples of commercially available polyamide-based elastomer include UBE polyamide elastomer, UBESTA XPA (manufactured by Ube Industries Ltd.), DAIAMID (manufactured by Daicel-Evonik Ltd.), PEBAX (manufactured by Toray Industries, Inc.), GRILON ELY (manufactured by EMS Japan Corporation), NOVAMID (manufactured by Mitsubishi Chemical Corporation), GRILAX (manufactured by DIC Corporation), polyetheresteramides PA-200, PA-201, TPAE-12 and TPAE-32, and polyesteramides TPAE-617 and TPAE-617C (manufactured by T&K TOKA Co., Ltd.).

<<<Polyimide-Based Elastomer>>>

The polyimide-based elastomer is not particularly limited and may be appropriately selected depending on the purpose. For example, use may be preferably made of a block polymer composed of an engineering plastic such as aromatic polyimide, and a rubber component such as polyether, polyester or polyolefin having a molecular weight of several hundreds to thousand which is a soft segment, in which a hard segment and a soft segment are alternately polycondensed. Specific examples of commercially available polyimide-based elastomer include UBESTA XPA9040F1 (manufactured by Ube Industries, Ltd.).

<<<Polyacrylic Elastomer>>>

The polyacrylic elastomer is not particularly limited and may be appropriately selected depending on the purpose. Examples of the polyacrylic elastomer include those having an acrylic acid ester such as ethyl acrylate, butyl acrylate, methoxyethyl acrylate, or ethoxyethyl acrylate as a main component, an acrylic acid ester, glycidyl methacrylate, and allyl glycidyl ether. Further, mention may be made of those obtained by copolymerizing crosslinking site monomers such as acrylonitrile and ethylene. Specific examples thereof include an acrylonitrile-butyl acrylate copolymer, an acrylonitrile-butyl acrylate-ethyl acrylate copolymer, and an acrylonitrile-butyl acrylate-glycidyl methacrylate copolymer.

<<<Silicone-Based Elastomer>>>

The silicone-based elastomer is not particularly limited and may be appropriately selected depending on the purpose. Examples of the silicone-based elastomer having organopolysiloxane as a main component include a polydimethyl siloxane-based elastomer, a polymethyl phenyl siloxane-based elastomer, and a polydiphenyl siloxane-based elastomer. Examples of commercially available silicone-based elastomer include KE series (manufactured by Shin-Etsu Chemical Co., Ltd.), and SE series, CY series, and SH series (all manufactured by Dow Corning Toray Co., Ltd.).

<<<Other Elastomers>>>

In the present invention, a rubber-modified epoxy resin (epoxy-based elastomer) may be used as the elastomer. The epoxy-based elastomer is obtained, for example, by modifying epoxy groups of a part or all of a bisphenol F type epoxy resin, a bisphenol A type epoxy resin, a salicylaldehyde type epoxy resin, a phenol novolak type epoxy resin or a cresol novolak type epoxy resin with a both-terminal carboxylic acid-modified butadiene-acrylonitrile rubber, a terminal amino-modified silicone rubber, or the like.

The content of the elastomer in the composition of the present invention is preferably 25 mass % or more, more preferably 28 mass % or more, and still more preferably 30 mass % or more. Since the composition of the present invention exhibits good solubility of the elastomer, it is possible to increase the concentration of the elastomer. By increasing the concentration of the elastomer in the composition, it is possible to form a thick film such as a sheet.

Further, the elastomer preferably accounts for 80 mass % or more of the total solid content in the composition of the present invention and more preferably 85 mass % or more.

Elastomer may contain a plurality of kinds listed above.

Further, the elastomer contains a styrene-based elastomer in an amount of preferably 50 to 100 mass %, more preferably 80 to 100 mass %, still more preferably 90 to 100 mass %, and even more preferably 95 to 100 mass %, and is particularly preferably composed substantially only of a styrene-based elastomer.

<<(B) Solvent Represented by General Formula (1) and Having Boiling Point of 160° C. or Higher>>

The composition of the present invention contains (B) a solvent represented by General Formula (1) and having a boiling point of 160° C. or higher (hereinafter, also referred to as solvent (B)).

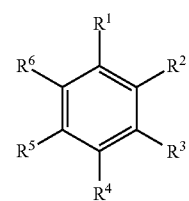

(1)

In General Formula (1), $R^1$ to $R^6$ each independently represent a hydrogen atom or an aliphatic hydrocarbon group.

$R^1$ to $R^6$ in General Formula (1) are not bonded to each other. That is, the compound represented by General Formula (1) is a monocyclic aromatic hydrocarbon.

Examples of the aliphatic hydrocarbon group represented by $R^1$ to $R^6$ include an alkyl group, an alkenyl group, and an alkynyl group, among which an alkyl group is preferred.

The number of carbon atoms in the alkyl group is preferably 1 to 20, more preferably 1 to 10, and still more preferably 1 to 5. The alkyl group is preferably linear or branched.

The number of carbon atoms in the alkenyl group is preferably 2 to 20, more preferably 2 to 10, and still more preferably 2 to 5. The alkenyl group is preferably linear or branched.

The number of carbon atoms in the alkynyl group is preferably 2 to 20, more preferably 2 to 10, and still more preferably 2 to 5. The alkenyl group is preferably linear or branched.

It is preferred that two to four of $R^1$ to $R^6$ are an aliphatic hydrocarbon group, and it is more preferred that two to three of $R^1$ to $R^6$ are an aliphatic hydrocarbon group.

The boiling point of the solvent (B) is 160° C. or higher, preferably 160 to 250° C., and more preferably 160° C. to 220° C. When the boiling point of the solvent (B) is within this range, drying properties of the composition are good. Furthermore, it is easy to form a film, such as a sheet, whose surface morphology is good with suppression of drying unevenness and thickness unevenness.

The Solubility Parameter (SP) value of the solvent (B) is preferably 19 $(MPa)^{1/2}$ or less and more preferably 18.5 $(MPa)^{1/2}$ or less. The lower limit is preferably, for example, 16.5 $(MPa)^{1/2}$ or more. When the SP value of the solvent (B) is 19 $(MPa)^{1/2}$ or less, it is possible to further increase the solubility of the elastomer.

With regard to SP values, the present invention uses values obtained according to a Hoy method. Preferred examples of the literature relating to the Hoy method include "H. L. Hoy: J. Paint Tech., 42(540), pp. 76 to 118 (1970)" and "SP Value Fundamentals, Application, and Calculation method" (Yamamoto, 2005, published by Johokiko Co., Ltd.).

Specific examples of the solvent (B) include mesitylene (boiling point of 165° C., and SP value of 18.0 $(MPa)^{1/2}$), p-diisopropylbenzene (boiling point of 210° C., and SP value of 17.6 $(MPa)^{1/2}$), p-diethylbenzene (boiling point of 181° C., and SP value of 18.0 $(MPa)^{1/2}$), m-diethylbenzene (boiling point of 182° C., and SP value of 17.8 $(MPa)^{1/2}$), and 1,3,5-triethylbenzene (boiling point of 218° C., and SP value 18.0 $(MPa)^{1/2}$).

The content of the solvent (B) in the composition of the present invention is preferably 50 to 75 mass %, more preferably 55 to 70 mass %, and still more preferably 60 to 70 mass %. When the content of the solvent (B) is within the above-specified range, solubility of the elastomer and drying properties are good.

<<(C) Solvent Having Boiling Point of Lower than 120° C.>>

The composition of the present invention contains (C) a solvent having a boiling point of lower than 120° C. (hereinafter, also referred to as solvent (C)).

The boiling point of the solvent (C) is lower than 120° C., preferably 110° C. or lower, and more preferably 105° C. or lower. The lower limit is preferably 60° C. or higher, more preferably 65° C. or higher, and still more preferably 70° C. or higher. When the boiling point of the solvent (C) is within this range, drying properties of the composition are good. Furthermore, it is easy to form a film, such as a sheet, whose surface morphology is good with suppression of drying unevenness and thickness unevenness.

The SP value of the solvent (C) is preferably 19 $(MPa)^{1/2}$ or less and more preferably 18.5 $(MPa)^{1/2}$ or less. The lower limit thereof is preferably, for example, 16.5 $(MPa)^{1/2}$ or more. When the SP value of the solvent (C) is 19 $(MPa)^{1/2}$ or less, it is possible to further increase the solubility of the elastomer.

One or more selected from an aromatic hydrocarbon, an alicyclic hydrocarbon and a cyclic ether may be used as the solvent (C).

Examples of the aromatic hydrocarbon include toluene (boiling point of 111° C., and SP value of 18.2 $(MPa)^{1/2}$) and benzene (boiling point of 80° C., and SP value of 18.5 $(MPa)^{1/2}$). Examples of the alicyclic hydrocarbon include cyclohexane (boiling point of 81° C., and SP value of 16.8 $(MPa)^{1/2}$) and methylcyclohexane (boiling point of 101° C., and SP value of 16.0 $(MPa)^{1/2}$).

Examples of the cyclic ether include tetrahydrofuran (boiling point of 66° C., and SP value of 19.5 $(MPa)^{1/2}$).

The content of the solvent (C) in the composition of the present invention is preferably 5 to 65 mass %, more preferably 5 to 60 mass %, and still more preferably 10 to 60 mass %. When the content of the solvent (C) is within the above-specified range, solubility of the elastomer and drying properties are good.

The mass ratio of solvent (B) to solvent (C) in the composition of the present invention is solvent (B):solvent (C) of preferably 80:20 to 99:1, more preferably 85:15 to 99:1, and still more preferably 90:10 to 99:1. When the mass ratio of the solvent (B) to the solvent (C) is within the above-specified range, the solubility of the elastomers is good, and it is therefore easy to form a film, such as a sheet, whose surface morphology is good while increasing drying properties.

<<Antioxidant>>

The composition of the present invention preferably contains an antioxidant. By incorporating an antioxidant, heat resistance of the resulting film can be further improved. Furthermore, it is easy to form a film, such as a sheet, whose laminatability is excellent.

A phenol-based antioxidant, a sulfur-based antioxidant, a phosphorus-based antioxidant, a quinone-based antioxidant, or an amine-based antioxidant may be used as the antioxidant.

Examples of the phenol-based antioxidant include p-methoxyphenol, 2,6-di-tert-butyl-4-methylphenol, "Irganox (registered trademark) 1010", "Irganox (registered trademark) 1330", "Irganox (registered trademark) 3114", and "Irganox (registered trademark) 1035" (manufactured by BASF Corporation), and "Sumilizer (registered trademark) MDP-S" and "Sumilizer (registered trademark) GA-80" (manufactured by Sumitomo Chemical Co., Ltd.).

Examples of the sulfur-based antioxidant include 3,3'-thiodipropionate distearyl, and "Sumilizer (registered trademark) TPM", "Sumilizer (registered trademark) TPS", and "Sumilizer (registered trademark) TP-D" (manufactured by Sumitomo Chemical Co., Ltd.).

Examples of the phosphorus-based antioxidant include tris(2,4-di-tert-butylphenyl)phosphite, bis(2,4-di-tert-butylphenyl)pentaerythritol diphosphite, poly(dipropylene glycol)phenyl phosphite, diphenyl isodecyl phosphite, 2-ethylhexyl diphenyl phosphite, triphenyl phosphite, and "Irgafos (registered trademark) 168" and "Irgafos (registered trademark) 38" (manufactured by BASF Corporation).

Examples of the quinone-based antioxidant include p-benzoquinone and 2-tert-butyl-1,4-benzoquinone.

Examples of the amine-based antioxidant include dimethylaniline and phenothiazine.

The antioxidant is preferably Irganox (registered trademark) 1010, Irganox (registered trademark) 1330, 3,3'-thiodipropionate distearyl, or Sumilizer (registered trademark) TP-D, more preferably Irganox (registered trademark) 1010 or Irganox (registered trademark) 1330, and particularly preferably Irganox (registered trademark) 1010.

Moreover, among the above-mentioned antioxidants, preferred is combined use of a phenol-based antioxidant and a sulfur-based antioxidant or a phosphorus-based antioxidant, and most preferred is combined use of a phenol-based antioxidant and a sulfur-based antioxidant. In particular, in a case where a polystyrene-based elastomer is used as the elastomer, it is preferred to use a phenol-based antioxidant and a sulfur-based antioxidant in combination. With such a combination, the effect of efficiently suppressing the degradation of the elastomer due to oxidation reactions can be expected. Furthermore, it is easy to form a film, such as a sheet, whose laminatability is excellent.

In a case where a phenol-based antioxidant and a sulfur-based antioxidant are used in combination, the mass ratio of the phenol-based antioxidant to the sulfur-based antioxidant is preferably phenol-based antioxidant:sulfur-based antioxidant of 95:5 to 5:95 and more preferably 25:75 to 75:25. When the mass ratio is within this range, it is possible to effectively prevent degradation of the film upon exposure of such a film to high temperatures.

The combination of antioxidants is preferably Irganox (registered trademark) 1010 and Sumilizer (registered trademark) TP-D, Irganox (registered trademark) 1330 and Sumilizer (registered trademark) TP-D, or Sumilizer (registered trademark) GA-80 and Sumilizer (registered trademark) TP-D, more preferably Irganox (registered trademark) 1010 and Sumilizer (registered trademark) TP-D, or Irganox (registered trademark) 1330 and Sumilizer (registered trademark) TP-D, and particularly preferably Irganox (registered trademark) 1010 and Sumilizer (registered trademark) TP-D.

The molecular weight of the antioxidant is preferably 400 or more, more preferably 600 or more, and particularly preferably 750 or more, from the viewpoint of preventing sublimation during heating.

The content of the antioxidant in the composition is preferably 1 to 7 mass %. The lower limit is more preferably 1.2 mass % or more and still more preferably 1.5 mass % or more. The upper limit is preferably 6 mass % or less and more preferably 5 mass % or less. When the content of the antioxidant is within this range, it is easy to form a film, such as a sheet, having good surface morphology and excellent heat resistance and laminatability.

The antioxidants may be of only one kind or may be of two or more kinds. In a case where two or more kinds of antioxidants are used, the total content of two or more antioxidants is preferably within the above-specified range.

<<<Polymer Compound>>>

If necessary, the composition of the present invention may contain a polymer compound other than the elastomers described above.

In the present invention, any compound may be used as the polymer compound. The polymer compound is a compound having a weight-average molecular weight of 2,000 or more and is typically a compound containing no polymerizable group. The weight-average molecular weight of the polymer compound is preferably 10,000 to 1,000,000, more preferably 50,000 to 500,000, and still more preferably 100,000 to 300,000.

Specific examples of the polymer compound include synthetic resins such as a hydrocarbon resin, a novolak resin, a phenol resin, an epoxy resin, a melamine resin, a urea resin, an unsaturated polyester resin, an alkyd resin, a polyvinyl chloride resin, a polyvinyl acetate resin, TEFLON (registered trademark), a polyamide resin, a polyacetal resin, a polycarbonate resin, a polybutylene terephthalate resin, a polyethylene terephthalate resin, a polysulfone resin, a polyether sulfone resin, and a polyarylate resin, and natural resins such as natural rubber. Among them, preferred is a hydrocarbon resin or a novolak resin, and more preferred is a hydrocarbon resin. The polymer compounds may be used in combination of two or more thereof, if necessary.

Any resin may be used as the hydrocarbon resin.

The hydrocarbon resin refers to a resin basically consisting only of carbon atoms and hydrogen atoms, but may contain other atoms as side chains as long as the basic skeleton is a hydrocarbon resin. That is, the hydrocarbon resin according to the present invention is intended to encompass not only a hydrocarbon resin consisting only of carbon atoms and hydrogen atoms, but also a case where a functional group other than a hydrocarbon group is directly bonded to the main chain, such as an acrylic resin, a polyvinyl alcohol resin, a polyvinyl acetal resin, or a polyvinyl pyrrolidone resin, in this case, the content of the repeating unit formed by direct bonding of a hydrocarbon group to the main chain being preferably 30 mol % or more with respect to the total repeating units in the resin.

Examples of the hydrocarbon resin satisfying the above-mentioned conditions include a terpene resin, a terpene phenol resin, a modified terpene resin, a hydrogenated terpene resin, a hydrogenated terpene phenol resin, a rosin, a rosin ester, a hydrogenated rosin, a hydrogenated rosin ester, a polymerized rosin, a polymerized rosin ester, a modified rosin, a rosin-modified phenol resin, an alkylphenol resin, an aliphatic petroleum resin, an aromatic petroleum resin, a hydrogenated petroleum resin, a modified petroleum resin, an alicyclic petroleum resin, a coumarone petroleum resin, an indene petroleum resin, a polystyrene-polyolefin copolymer, an olefin polymer (for example, a methylpentene copolymer), and a cycloolefin polymer (for example, a norbornene copolymer, a dicyclopentadiene copolymer, or a tetracyclododecene copolymer).

Among them, the hydrocarbon resin is preferably a terpene resin, a rosin, a petroleum resin, a hydrogenated rosin, a polymerized rosin, an olefin polymer or a cycloolefin polymer, more preferably a terpene resin, a rosin, an olefin polymer or a cycloolefin polymer still more preferably a terpene resin, a rosin, a cycloolefin polymer or an olefin polymer, and particularly preferably a cycloolefin polymer.

Examples of the cycloolefin polymer include a norbornene-based polymer, a polymer of monocyclic cyclic olefins, a polymer of cyclic conjugated dienes, a vinyl alicyclic hydrocarbon polymer, and hydrides of these polymers. Preferred examples of the cycloolefin polymer include an addition (co)polymer containing at least one repeating unit represented by the following General Formula (II), and an addition (co)polymer further containing at least one or more of repeating units represented by General Formula (I). Other preferred examples of the cycloolefin polymer include a ring-opening (co)polymer containing at least one cyclic repeating unit represented by General Formula (III).

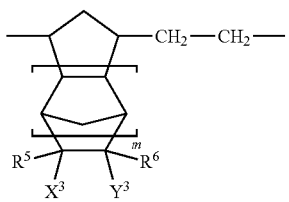

General Formula (III)

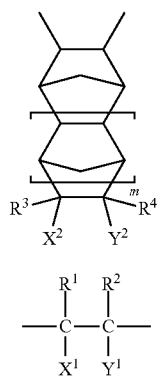

General Formula (II)

General Formula (I)

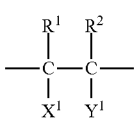

In the formulae, m represents an integer of 0 to 4. $R^1$ to $R^6$ each represent a hydrogen atom or a hydrocarbon group having 1 to 10 carbon atoms, $X^1$ to $X^3$, and $Y^1$ to $Y^3$ each represent a hydrogen atom, a hydrocarbon group having 1 to 10 carbon atom, a halogen atom, a hydrocarbon group having 1 to 10 carbon atoms and substituted with a halogen atom, $-(CH_2)_nCOOR^{11}$, $-(CH_2)_nOCOR^{12}$, $-(CH_2)_nNCO$, $-(CH_2)_nNO_2$, $-(CH_2)_nCN$, $-(CH_2)_nCONR^{13}R^{14}$, $-(CH_2)_nNR^{15}R^{16}$, $-(CH_2)_nOZ$, $-(CH_2)_nW$, or $(-CO)_2O$ or $(-CO)_2NR^{17}$ composed of $X^1$ and $Y^1$, $X^2$ and $Y^2$, or $X^3$ and $Y^3$. $R^{11}$, $R^{12}$, $R^{13}$, $R^{14}$, $R^{15}$, $R^{16}$, and $R^{17}$ each represent a hydrogen atom or a hydrocarbon group (preferably a hydrocarbon group having 1 to 20 carbon atoms), Z represents a hydrocarbon group or a halogen-substituted hydrocarbon group, and W represents $SiR^{18}_pD_{3-p}$ (in which $R^{18}$ represents a hydrocarbon group having 1 to 10 carbon atoms, D represents a halogen atom, $-OCOR^{18}$ or $-OR^{18}$, and p represents an integer of 0 to 3). n represents an integer of 0 to 10.

A norbornene-based polymers has been disclosed in JP1998-7732A (JP-H10-7732A), JP2002-504184A, US2004/229157A1 or WO2004/070463A1. The norbornene-based polymer can be obtained by addition polymerization of norbornene-based polycyclic unsaturated compounds. If necessary, it may be possible to carry out addition polymerization of a norbornene-based polycyclic unsaturated compound with a conjugated diene such as ethylene, propylene, butene, butadiene or isoprene; or a non-conjugated diene such as ethylidene norbornene. This norbornene-based polymer was launched under the trade name of APEL from Mitsui Chemicals, Inc., in which there is a grade with a different glass transition temperature (Tg), for example APL8008T (Tg 70° C.), APL6013T (Tg 125° C.) or APL6015T (Tg 145° C.). Pellets such as TOPAS 8007, TOPAS 5013, TOPAS 6013, and TOPAS 6015 were launched from Polyplastics Co., Ltd. Further, Appear3000 has been launched from Ferrania S.p.A.

The hydride of a norbornene-based polymer can be prepared by subjecting a polycyclic unsaturated compound to addition polymerization or metathesis ring-opening polymerization and then hydrogenation, as disclosed in JP1989-240517A (JP-H01-240517A), JP1995-196736A (JP-H07-196736A), JP1985-26024A (JP-S60-26024A), JP1987-19801A (JP-S62-19801A), JP2003-1159767A or JP2004-309979A.

In General Formula (III), $R^5$ and $R^6$ are preferably a hydrogen atom or a methyl group, $X^3$ and $Y^3$ are preferably a hydrogen atom, and the other groups are appropriately selected. This norbornene-based polymer has been launched under the trade name of Arton G or Arton F from JSR Corporation, and is also commercially available under the trade name Zeonor ZF14 and ZF16, and Zeonex 250, Zeonex 280, and Zeonex 480R from Zeon Corporation.

In a case where the composition of the present invention contains a polymer compound, the content of the polymer compound is preferably 5 mass % or more, more preferably 10 mass % or more, and still more preferably 20 mass % or more, with respect to the total solid content in the composition of the present invention. The upper limit of the content of the polymer compound is preferably 70 mass % or less, more preferably 60 mass % or less, still more preferably 50 mass % or less, and particularly preferably 40 mass % or less, with respect to the total solid content in the composition of the present invention.

The composition of the present invention may be made into a configuration which is substantially free of a polymer compound other than an elastomer. Regarding the phrase "substantially free of a polymer compound", for example, the content of the polymer compound is preferably 1 mass % or less and more preferably 0.1 mass % or less with respect to the total solid content of the elastomer, and it is still more preferred that the polymer compound is not incorporated.

<<<Surfactant>>>

The composition of the present invention may contain a surfactant. Examples of the surfactant that can be used include various surfactants such as a fluorine-based surfactant, a nonionic surfactant, a cationic surfactant, an anionic surfactant, and a silicone-based surfactant, among which a fluorine-based surfactant is preferred. By including a surfactant, liquid properties (particularly, fluidity) are improved, and in a case where an adhesive film is applied and formed, it is possible to further improve coating thickness uniformity and liquid-saving properties.

The fluorine content of the fluorine-based surfactant is preferably is 3 to 40 mass %, more preferably 5 to 30 mass %, and still more preferably 7 to 25 mass %. The fluorine-based surfactant whose fluorine content is within this range is effective in terms of coating film thickness uniformity and liquid-saving properties. Furthermore, the solubility is also good.

Examples of the fluorine-based surfactant include MEGAFAC F-251, MEGAFAC F-281, MEGAFAC F-430, MEGAFAC F-444, MEGAFAC F-477, MEGAFAC F-510, MEGAFAC F-552, MEGAFAC F-553, MEGAFAC F-554, MEGAFAC F-555, MEGAFAC F-556, MEGAFAC F-557, MEGAFAC F-558, MEGAFAC F-559, MEGAFAC F-560, MEGAFAC F-561, MEGAFAC F-562, MEGAFAC F-563, MEGAFAC F-565, MEGAFAC F-567, MEGAFAC F-568, MEGAFAC F-569, MEGAFAC F-570, MEGAFAC F-571, MEGAFAC R-40, MEGAFAC R-41, MEGAFAC R-43, and MEGAFAC R-94 (manufactured by DIC Corporation), FC-4430 and FC-4432 (manufactured by Sumitomo 3M Limited), SURFLON S-242, SURFLON S-243, SURFLON S-386, SURFLON S-651, SURFLON S-611, and SURFLON S-420 (manufactured by AGC Seimi Chemical Co., Ltd.), and PF-636, PF-656, PF-6320, PF-6520, and PF-7002 (manufactured by OMNOVA Solutions Inc.).

Examples of the nonionic surfactant include glycerol, trimethylol propane, trimethylol ethane, and ethoxylates and propoxylates thereof (for example, glycerol propoxylate, and glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, and polyethylene glycol distearate.

Examples of the cationic surfactant include EFKA-745 (manufactured by MORISHITA & CO., LTD.), and POLYFLOW No. 75, No. 90, and No. 95 (manufactured by Kyoeisha Chemical Co., Ltd.).

Examples of the silicone-based surfactant include TSF-4440, TSF-4300, TSF-4445, TSF-4460, and TSF-4452 (manufactured by Momentive Performance Materials Japan LLC), KP-341, KF-6001, and KF-6002 (manufactured by Shin-Etsu Chemical Co., Ltd.), and BYK-307, BYK-323, and BYK-330 (manufactured by BYK-Chemie GmbH).

In a case where the composition of the present invention contains a surfactant, the content of the surfactant in the composition of the present invention is preferably 0.001 to 2.0 mass % and more preferably 0.005 to 1.0 mass %.

The surfactants may be of only one kind or may be of two or more kinds. In a case where two or more kinds of surfactants are used, the total content of two or more surfactants is preferably within the above-specified range.

<<Other Additives>>

If necessary, the composition of the present invention may contain various additives, for example, a curing agent, a curing catalyst, a filler, an adhesion promoter, an ultraviolet absorber, and an aggregation preventing agent, within a range not to impair the effects of the present invention. In a case where these additives are blended, the total amount of additives is preferably less than or equal to 3 mass % of the total solid content in the composition.

<Preparation of Composition>

The composition of the present invention can be prepared by mixing the above-mentioned individual components. Mixing of the individual components is usually carried out in the range of 0° C. to 100° C. Also, after mixing the individual components, it is preferred to filter the mixture through, for example a filter. The filtration may be carried out in multiple steps or may be repeated in many times. It is also possible to re-filter the filtrate.

Any filter may be used without particular limitation as long as it is conventionally used for filtration or the like. For example, the filter may be a filter made of a fluororesin such as polytetrafluoroethylene (PTFE), a polyamide-based resin such as nylon-6 or nylon-6,6, a polyolefin resin such as polyethylene or polypropylene (PP) (including ones having a high density and an ultra-high molecular weight), or the like. Among these materials, preferred are polypropylene (including high-density polypropylene) and nylon.

The pore size of the filter is suitably, for example, about 0.003 to 5.0 μm. By specifying the pore size of the filter to be this range, it becomes possible to reliably remove fine foreign materials such as impurities and aggregates contained in the composition, while suppressing filtration clogging.

In the use of filter, different filters may be used in combination. In that case, filtering by a first filter may be carried out only once or two or more times. In a case of filtering two or more times by combining different filters, pore size for a second or subsequent filtering is preferably made smaller than or equal to that for a first filtering. In addition, first filters having a different pore size in the above-mentioned range may be used in combination. The pore size herein can be set by referring to nominal values of filter manufacturers. Commercially available filters can be selected from various filters supplied by, for example, Nihon Pall Ltd., Advantec Toyo Kaisha, Ltd., Nihon Entegris K.K. (formerly Nihon Mykrolis K.K.) or Kitz Micro Filter Corporation.

The composition of the present invention preferably has a solid content of 25 to 40 mass %. The lower limit is more preferably 26 mass % or more and still more preferably 27 mass % or more. The upper limit is more preferably 38 mass % or less and still more preferably 36 mass % or less.

The composition of the present invention exhibits good solubility of an elastomer, and it is therefore possible to increase a concentration of solid contents. When the concentration of solid contents is within the above-specified range, it may also be possible to form a thick sheet.

<Sheet, Laminate, and Process for Producing Sheet>

The process for producing a sheet according to the present invention includes a step of applying the above-mentioned composition onto a support, and drying the applied composition.

The sheet of the present invention is obtained by drying the above-mentioned composition.

The laminate of the present invention includes a sheet obtained by drying the above-mentioned composition and a support having releasability which is provided on one side or both sides of the sheet.

Hereinafter, a sheet and a laminate will also be described, using the process for producing a sheet according to the present invention.

In the process for producing a sheet according to the present invention, examples of the method of applying a composition include a method of extruding and applying a composition from a slit-like opening, a method of transferring and applying a composition with a gravure or an anilox roller, a method of scanning and applying a composition while discharging such a composition from a sprayer or a dispenser, a method of dip coating a composition by storing the composition in a tank and passing a support therein, and a method of applying a composition while pushing and scraping the composition with a wire bar.

Examples of the support onto which the composition is applied include a drum and a band. It may also be possible to use a peeling film (support having releasability) as the support.

It is possible to obtain a single sheet (film) by applying a composition onto a support, drying the applied composition into a solidified sheet, and then mechanically peeling the sheet from the support.

Drying conditions are preferably at 100° C. to 210° C. for 120 to 900 seconds. The drying temperature is more preferably 105° C. to 200° C. and still more preferably 110° C. to 190° C. The drying time is more preferably 150 to 800 seconds and still more preferably 180 to 600 seconds.

Drying may be carried out by stepwise increasing the temperature in two steps.

Further, in a case where a peeling film is used as the support onto which a composition is applied, the sheet may be formed into a sheet with a peeling film attached thereto (laminate) by leaving the sheet intact without peeling it from the support.

By carrying out these processes continuously, it is possible to obtain a roll-like long sheet. The length of the long sheet is not particularly limited. The lower limit is, for example, preferably 5,000 mm or more and more preferably 1,000 mm or more. The upper limit is, for example, preferably 500,000 mm or less and more preferably 200,000 mm or less.

Further, the sheet may be formed into a sheet with a peeling film attached on both sides thereof (laminate) by bonding a peeling film (support having releasability) on both sides of the sheet.

By bonding a peeling film on one or both sides of a sheet, it is possible to prevent occurrence of scratches on the surface of the sheet, and a trouble of sticking during storage. The peeling film may be peeled off prior to use of the sheet. For example, in a case where a peeling film is affixed on both sides, it is possible to keep the cleanliness of the sheet surface as much as possible by peeling off the peeling film on one surface, laminating the sheet surface on a device wafer or a support, and then peeling off the other remaining peeling film.

In the present invention, the average thickness of the sheet is not particularly limited, but it is, for example, preferably 40 to 140 µm, more preferably 50 to 130 µm, and still more preferably 60 to 120 µm. When the average thickness of the sheet is within the above-specified range, due to having a good followability to the surface shape of the device wafer, the sheet can be uniformly bonded to the device surface of the device wafer. Furthermore, outgassing increase at the time of processing after temporary bonding, and the deviation at the time of bonding are less likely to occur.

In the present invention, the average thickness of the sheet is defined as an average of the values of the thickness at five positions at equal intervals in the direction from one end face to the other end face in a cross section along the direction of the sheet, as measured by a micrometer.

In the present invention, the term "cross section along the direction of the sheet" is to be a cross section perpendicular to the long side direction, in a case where the sheet is of a polygonal shape. Further, in a case where the sheet is of a square shape, the cross section along the direction of the sheet is to be a cross section perpendicular to any one of sides. Further, in a case where the sheet is of a circular or elliptical shape, the cross section along the direction of the sheet is to be a cross section which passes through the center of gravity.

In a cross section along the direction of the sheet, the difference between the maximum film thickness and the minimum film thickness of the sheet is preferably 10% or less of the average film thickness, and more preferably 5% or less.

In the present invention, the sheet has a solvent content of preferably 1 mass % or less and more preferably 0.1 mass % or less, and is ideally substantially free of a solvent, for example, has a solvent content of 0 mass %.

<Adhesive Support Substrate>

Next, an adhesive support substrate using the sheet of the present invention will be described.

The adhesive support substrate has the sheet of the present invention on the surface of a support substrate.

A laminate for temporary bonding can be formed by laminating the sheet of the present invention on a support substrate. For example, there is a method in which a sheet is set on a vacuum laminator, the sheet is positioned on a support substrate by the present apparatus, the sheet and the support substrate are brought into contact under vacuum, and the sheet is fixed (laminated) on the support substrate by compression with a roller or the like. Further, the sheet fixed to the support substrate may be cut into a desired shape, for example, a circular shape.

In the adhesive support substrate, the support substrate is not particularly limited and examples thereof include a silicon substrate, a glass substrate, a metal substrate, and a compound semiconductor substrate. Among them, a silicon substrate is preferred in view of the point that a silicon substrate typically used as a substrate of a semiconductor device is hardly contaminated and it is possible to use an electrostatic chuck which is commonly used in the production process of a semiconductor device.

The thickness of the support substrate is not particularly limited. For example, the thickness of the support substrate is preferably 300 µm to 100 mm and more preferably 300 µm to 10 mm.

A release layer may be provided on the surface of the support substrate. The release layer is preferably a low surface energy layer containing a fluorine atom and/or a silicon atom, and preferably has a material containing a fluorine atom and/or a silicon atom. The fluorine content of the release layer is preferably 30 to 80 mass %, more preferably 40 to 76 mass %, and particularly preferably 60 to 75 mass %.

<Laminate with Device Wafer>

Next, a laminate with a device wafer according to the present invention will be described.

The laminate with a device wafer according to the present invention has the above-mentioned sheet of the present invention between a device wafer and a support substrate, with one surface of the sheet being in contact with the device surface of the device wafer and the other surface being in contact with the surface of the support substrate.

A known device wafer may be used, without limitation, as the device wafer, and examples thereof include a silicon substrate and a compound semiconductor substrate. Specific examples of the compound semiconductor substrate include a SiC substrate, a SiGe substrate, a ZnS substrate, a ZnSe substrate, a GaAs substrate, an InP substrate, and a GaN substrate.

A mechanical structure or circuit may be formed on the surface of the device wafer. Examples of the device wafer with a mechanical structure or circuit formed thereon include a Micro Electro Mechanical System (MEMS), a power device, an image sensor, a micro sensor, a LED, an optical device, an interposer, an embeddable device, and a microdevice.

The device wafer preferably has a structure such as a metal bump. According to the present invention, it is possible to stably achieve temporary bonding even for a device wafer having a structure on the surface and it is also possible to easily release the temporary bonding to the device wafer. The height of the structure is not particularly limited, but it is, for example, preferably 1 to 150 µm and more preferably 5 to 100 µm.

The thickness of the device wafer before being subjected to a mechanical or chemical treatment is preferably 500 µm or more, more preferably 600 µm or more, and still more preferably 700 µm or more. The upper limit is, for example, preferably 2,000 µm or less and more preferably 1,500 µm or less.

The thickness of the device wafer after being subjected to reduction of a film thickness by carrying out a mechanical or chemical treatment is, for example, preferably less than 500 µm, more preferably 400 µm or less, and still more preferably 300 µm or less. The lower limit is, for example, preferably 1 µm or more and more preferably 5 µm or more.

In the laminate with a device wafer according to the present invention, the support substrate has the same definition of the support substrate described in the above-mentioned adhesive support substrate, and a preferred range thereof is also the same.

The laminate with a device wafer according to the present invention may also be produced by placing the above-mentioned sheet of the present invention between the support substrate and the device wafer, followed by thermo-compression bonding.

<Method of Producing Semiconductor Device>

Hereinafter, an embodiment of a production method of a semiconductor device which has passed through a process of producing a laminate with a device wafer will be described with reference to FIG. 1. The present invention is not limited to the following embodiments.

FIGS. 1(A) to 1(E) are respectively a schematic cross-sectional view illustrating a temporary bonding between the support substrate and the device wafer (FIGS. 1(A) and 1(B)), a schematic cross-sectional view showing a state in which the device wafer temporarily bonded to the support substrate is made into a thin thickness (FIG. 1(C)), a schematic cross-sectional view showing a state in which the support substrate and the device wafer are peeled (FIG. 1(D)), and a schematic cross-sectional view showing a state after the removal of an adhesive layer from the device wafer (FIG. 1(E)).

In this embodiment, as shown in FIG. 1(A), first, an adhesive support substrate 100 formed by providing a sheet 11 on a support substrate 12 is prepared. The adhesive support substrate 100 can be produced according to the above-described method. Preferred is an aspect in which the adhesive support substrate 100 is substantially free of a solvent.

A device wafer 60 is established by providing a plurality of device chips 62 on a surface 61a of a silicon substrate 61.

The thickness of the silicon substrate 61 is preferably, for example, 200 to 1,200 μm. The device chips 62 are preferably, for example, a metal structure, and the height thereof is preferably 10 to 100 μm.

Then, as shown in FIG. 1(B), the adhesive support substrate 100 and the device wafer 60 are compressed to thereby achieve temporal bonding between the support substrate 12 and the device wafer 60.

The sheet 11 preferably completely covers the device chips 62 and, in a case where the height of the device chip is X μm and the thickness of the sheet is Y μm, it is preferable to satisfy the relationship of "X+100≥Y>X".

A complete covering of the device chips 62 by the sheet 11 is effective in a case where a Total Thickness Variation (TTV) of a thin device wafer is intended to be more reduced (that is, in a case where the flatness of the thin device wafer is intended to be further improved).

That is, in a case where the device wafer is thinned, it is possible to almost eliminate the irregularities on the contact surface with the support substrate 12, by protecting the plurality of device chips 62 by the sheet 11. Thus, even when such a device wafer is subjected to the thinning in the state of being supported in this way, the fear that the shape derived from the plurality of device chips 62 is transferred to the rear surface 61b1 of the thin device wafer is reduced and as a result, the TTV of the finally obtained thin device wafer can be further reduced.

Next, as shown in FIG. 1(C), the rear surface 61b of the silicon substrate 61 is subjected to a mechanical or chemical treatment (although being not particularly limited, for example, a thinning treatment such as grinding or chemical mechanical polishing (CMP), a treatment under high temperatures and vacuum such as chemical vapor deposition (CVD) or physical vapor deposition (PVD), a treatment with chemicals such as an organic solvent, an acidic treatment liquid or a basic treatment liquid, a plating treatment, actinic ray irradiation, or a heating and cooling treatment), and as shown in FIG. 1(C), the thickness of the silicon substrate 61 is reduced (for example, an average thickness of preferably less than 500 μm and more preferably 1 to 200 μm), thereby obtaining a thin device wafer 60a.

Further, as a mechanical or chemical treatment following the thinning treatment, a treatment for forming a through hole (not shown) passing through the silicon substrate from the rear surface 61b1 of the thin device wafer 60a and forming a through-silicon electrode (not shown) in the through hole may be carried out. More specifically, the highest reachable temperature in the heating treatment is preferably 130° C. to 400° C. and more preferably 180° C. to 350° C. The highest reachable temperature in the heating treatment is preferably set to a temperature lower than the softening point of the sheet. The heating treatment is preferably carried out by heating of 30 seconds to 30 minutes at the highest reachable temperature and more preferably heating of 1 minute to 10 minutes at the highest reachable temperature.

Next, as shown in FIG. 1(D), the support substrate 12 is dissociated from the thin device wafer 60a. A method for the dissociation is not particularly limited and it is preferable to peel the support substrate 12 from the thin device wafer 60a by pulling the support substrate 12 in the direction perpendicular to the thin device wafer 60a from an edge of the thin device wafer 60a while not carrying out any treatment. At this time, regarding the peeling interface, peeling is preferably achieved at the interface between the support substrate 12 and the sheet 11. In this case, when the peel strength at the interface between the support substrate 12 and the sheet 11 is taken as A and the peel strength between the device wafer surface 61a and the sheet 11 is taken as B, it is preferable to satisfy the following equation.

$$A<B \qquad \text{Equation (1)}$$

The peeling may be carried out by bringing the sheet 11 into contact with the peeling liquid to be described hereinafter, and then, if desired, sliding the thin device wafer 60a to the support substrate 12 and then pulling in the direction perpendicular to the device wafer from an edge of the thin device wafer 60a.

<Peeling Liquid>

Hereinafter, the peeling liquid will be described in detail.

As the peeling liquid, water and a solvent (organic solvent) can be used.

Further, an organic solvent capable of dissolving the sheet 11 is preferable as the peeling liquid. Examples of the organic solvent include an aliphatic hydrocarbon (hexane, heptane, ISOPAR E, H, and G (manufactured by Esso Chemical Co., Ltd.), or the like), an aromatic hydrocarbon (toluene, xylene, or the like), a halogenated hydrocarbon (methylene dichloride, ethylene dichloride, trichloroethylene, monochlorobenzene, or the like), and a polar solvent. Examples of the polar solvent include alcohols (methanol, ethanol, propanol, isopropanol, 1-butanol, 1-pentanol, 1-hexanol, 1-heptanol, 1-octanol, 2-octanol, 2-ethyl-1-hexanol, 1-nonanol, 1-decanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, propylene glycol monophenyl ether, methyl phenyl carbinol, n-amyl alcohol, methylamyl alcohol, and the like), ketones (acetone, methyl ethyl ketone, ethyl butyl ketone, methyl isobutyl ketone, cyclohexanone, and the like), esters (ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate, butyl levulinate, and the like), and others (triethyl phosphate, tricresyl phosphate, N-phenylethanolamine, N-phenyldiethanolamine, N-methyldiethanolamine, N-ethyldiethanolamine, 4-(2-hydroxyethyl)morpholine, N,N-dimethylacetamide, N-methylpyrrolidone, and the like).

Further, the peeling liquid may contain an alkali, an acid, and a surfactant from the viewpoint of peelability. In a case of blending these components, the blending amounts are each preferably 0.1 to 5.0 mass % with respect to the peeling liquid.

In addition, an embodiment of mixing two or more organic solvents and water or an embodiment of mixing two or more alkalis, acids and surfactants is also preferable from the viewpoint of peelability.

As the alkali, an inorganic alkali agent such as, for example, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, or lithium hydroxide, or an organic alkali agent such as, for example, monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, or tetramethylammonium hydroxide can be used. These alkali agents may be used alone or in combination of two or more thereof.

As the acid, an inorganic acid such as hydrogen halide, sulfuric acid, nitric acid, phosphoric acid, or boric acid, or an organic acid such as methanesulfonic acid, ethanesulfonic acid, benzenesulfonic acid, p-toluenesulfonic acid, trifluoromethanesulfonic acid, acetic acid, citric acid, formic acid, gluconic acid, lactic acid, oxalic acid, or tartaric acid can be used.

As the surfactant, an anionic, cationic, nonionic or zwitterionic surfactant can be used. In this case, the content of the surfactant is preferably 1 to 20 mass % and more preferably 1 to 10 mass %, with respect to the total amount of the aqueous alkali solution.

By setting the content of the surfactant to be within the above-specified range, the peelability of the sheet 11 from the thin device wafer 60a tends to be further improved.

The anionic surfactant is not particularly limited and examples thereof include fatty acid salts, abietates, hydroxyalkane sulfonates, alkane sulfonates, dialkylsulfosuccinates, linear alkylbenzene sulfonates, branched alkylbenzene sulfonates, alkylnaphthalene sulfonates, alkyldiphenyl ether (di)sulfonates, alkylphenoxy polyoxyethylene alkyl sulfonates, polyoxyethylene alkylsulfophenyl ether salts, N-alkyl-N-oleyltaurine sodium salts, N-alkylsulfosuccinic acid monoamide disodium salts, petroleum sulfonates, sulfated castor oil, sulfated beef tallow oil, sulfate ester salts of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymers, partially saponified products of olefin-maleic anhydride copolymers, and naphthalene sulfonate formalin condensates. Among these, alkylbenzene sulfonates, alkylnaphthalene sulfonates, and alkyldiphenyl ether(di)sulfonates are particularly preferably used.

The cationic surfactant is not particularly limited and conventionally known cationic surfactants can be used. Examples of the cationic surfactant include alkylamine salts, quaternary ammonium salts, alkylimidazolinium salts, polyoxyethylene alkyl amine salts, and polyethylene polyamine derivatives.

The nonionic surfactant is not particularly limited and examples thereof include polyethylene glycol type higher alcohol ethylene oxide adducts, alkylphenol ethylene oxide adducts, alkylnaphthol ethylene oxide adducts, phenol ethylene oxide adducts, naphthol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, ethylene oxide adducts of fat, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols, and fatty acid amides of alkanolamines. Among these, those having an aromatic ring and an ethylene oxide chain are preferable, and alkyl-substituted or unsubstituted phenol ethylene oxide adducts and alkyl-substituted or unsubstituted naphthol ethylene oxide adducts are more preferable.

The zwitterionic surfactant is not particularly limited and examples thereof include amine oxide-based surfactants such as alkyldimethylamine oxide, betaine-based surfactants such as alkyl betaine, and amino acid-based surfactants such as sodium salts of alkylamino fatty acids. In particular, alkyldimethylamine oxide which may have a substituent, alkyl carboxyl betaine which may have a substituent, and alkyl sulfo betaine which may have a substituent are preferably used. Specifically, the compounds represented by Formula (2) described in paragraph [0256] of JP2008-203359A, the compounds represented by Formulae (I), (I), and (VI) described in paragraph [0028] of JP2008-276166A, and the compounds described in paragraphs [0022] to [0029] of JP2009-47927A can be used.

The peeling liquid may also contain additives such as an anti-foaming agent and a water softener, if desired.

Next, it is possible to obtain a thin device wafer by removing the sheet 11 from the thin device wafer 60a, as shown in FIG. 1(E).

Examples of a method for removing the sheet 11 include a method in which the sheet 11 is peeled and removed in the form of a film itself (mechanical peeling), a method in which the sheet 11 is swollen with a peeling liquid and then peeled and removed, a method in which a peeling liquid is sprayed to destroy and remove the sheet, a method in which the sheet 11 is dissolved in a peeling liquid and then removed, and a method in which the sheet 11 is decomposed and vaporized by irradiation with actinic rays, radiation or heat. A method in which the sheet 11 is peeled and removed in the form of a film itself or a method in which the sheet 11 is dissolved in an aqueous solution or an organic solvent and removed can be preferably used. From the viewpoint of reducing the used amount of a solvent, it is preferable to remove the sheet 11 in the form of a film itself. In order to remove the sheet 11 in the form of a film itself, it is preferred that the peel strength B of the device wafer surface 61a and the sheet 11 satisfies the following Equation (2).

$$B \leq 4 \text{ N/cm} \qquad \text{Equation (2)}$$

In the present invention, when the support substrate 12 is peeled off from the thin device wafer 60a, it is preferable to peel the support substrate 12 by pulling the support substrate 12 in the direction perpendicular to the device wafer from an edge of the thin device wafer 60a while not carrying out any treatment, and the method of removing the sheet 11 on the device wafer surface 61a is preferable to remove the sheet 11 in the form of a film itself.

By satisfying both the above-mentioned Equations (1) and (2) when the peel strength at the interface between the support substrate 12 and the sheet 11 is taken as A and the peel strength between the device wafer surface 61a and the sheet 11 is taken as B, it is possible to remove the support substrate 12 and the sheet 11 from the device wafer in the above-described embodiment.

Incidentally, when peeling the support substrate from the device wafer, the step of FIG. 1(E) may be omitted in a case where peeling is carried out at the interface between the device wafer and the sheet 11 (that is, in a case where the sheet 11 does not remain on the device wafer side).

After the support substrate 12 is dissociated from the thin device wafer 60a, if desired, the thin device wafer 60a is subjected to various known treatments to produce a semiconductor device having the thin device wafer 60a.

Furthermore, in a case where the sheet 11 is attached to the support substrate, the support substrate can be regenerated by removing the sheet 11. Examples of a method for removing the sheet 11 include a physical removal method such as a method in which the sheet 11 is removed in the form of a film itself, by a brush, ultrasonic waves, ice particles, or aerosol spraying; and a chemical removal method such as a method in which the sheet 11 is dissolved in an aqueous solution or an organic solvent and removed, or a method in which the sheet 11 is decomposed and vaporized by irradiation with actinic rays, radiation or heat, but conventionally known cleaning methods can be used depending on the support substrate.

For example, in a case where a silicon substrate is used as the support substrate, conventionally known methods for cleaning a silicon wafer can be used. Examples of the aqueous solution or organic solvent that can be used in a case of chemical removal include a strong acid, a strong base, a strong oxidizing agent, and a mixture thereof, specifically, acids such as sulfuric acid, hydrochloric acid, hydrofluoric acid, nitric acid, and an organic acid, bases such as tetramethylammonium, ammonia, and an organic base, an oxidizing agent such as hydrogen peroxide, a mixture of ammonia and hydrogen peroxide, a mixture of hydrochloric acid and aqueous hydrogen peroxide, a mixture of sulfuric acid and aqueous hydrogen peroxide, a mixture of hydrofluoric acid and aqueous hydrogen peroxide, and a mixture of hydrofluoric acid and ammonium fluoride.

From the viewpoint of adhesiveness in a case of using the regenerated support substrate, it is preferable to use a cleaning liquid.

It is preferred that the cleaning liquid contains an acid (strong acid) having a pKa of less than 0 and hydrogen peroxide. The acid having a pKa of less than 0 is selected from an inorganic acid such as hydrogen iodide, perchloric acid, hydrogen bromide, hydrogen chloride, nitric acid, or sulfuric acid, and an organic acid such as alkylsulfonic acid or arylsulfonic acid. From the viewpoint of cleaning properties, an inorganic acid is preferable and sulfuric acid is most preferable.

30 mass % hydrogen peroxide can be preferably used as the hydrogen peroxide, and the mixing ratio of the strong acid to the 30 mass % hydrogen peroxide is preferably 0.1:1 to 100:1, more preferably 1:1 and 10:1, and most preferably 3:1 to 5:1 in terms of a mass ratio.

EXAMPLES

Hereinafter, the present invention will be described more specifically with reference to the following Examples, but the present invention is not limited thereto as long as the gist of the present invention is not deviated. Here, "part(s)" and "%" are on the basis of mass unless otherwise specified.

The following components were mixed into a homogeneous solution which was then subjected to filtration using a polytetrafluoroethylene filter having a pore size of 5 μm, thereby preparing a composition.

<Composition of Composition>

(A) a polymer given in Table 1: part(s) by mass given in Table 1

(B) a solvent having a boiling point of 160° C. or higher given in Table 1: part(s) by mass given in Table 1

(C) a solvent having a boiling point of lower than 120° C. given in Table 1: part(s) by mass given in Table 1

(D) an antioxidant (1:1 mixture of Irganox (registered trademark) 1010 (manufactured by BASF Corporation) and Sumilizer (registered trade mark) TP-D (manufactured by Sumitomo Chemical Co., Ltd.)): part(s) by mass given in Table 1

DAIFREE FB-962 (manufactured by Daikin Industries Co., Ltd.): 0.05 parts by mass MEGAFAC F-557 (manufactured by DIC Corporation): 0.1 parts by mass

TABLE 1

| | (A) Polymer | | (B) Solvent having boiling point of 160° C. or higher | | (C) Solvent having boiling point of lower than 120° C. | | (D) Antioxidant |
|---|---|---|---|---|---|---|---|
| | Type | Parts by mass | Type | Parts by mass | Type | Parts by mass | Parts by mass |
| Example 1 | A-1 | 28.16 | B-1 | 21.00 | C-1 | 49.00 | 1.80 |
| Example 2 | A-1 | 28.16 | B-1 | 35.00 | C-1 | 35.00 | 1.80 |
| Example 3 | A-1 | 28.16 | B-1 | 49.00 | C-1 | 21.00 | 1.80 |
| Example 4 | A-1 | 28.16 | B-1 | 63.00 | C-1 | 7.00 | 1.80 |

TABLE 1-continued

|  | (A) Polymer | | (B) Solvent having boiling point of 160° C. or higher | | (C) Solvent having boiling point of lower than 120° C. | | (D) Antioxidant |
| --- | --- | --- | --- | --- | --- | --- | --- |
|  | Type | Parts by mass | Type | Parts by mass | Type | Parts by mass | Parts by mass |
| Example 5 | A-1 | 28.16 | B-1 | 21.00 | C-2 | 49.00 | 1.80 |
| Example 6 | A-1 | 28.16 | B-2 | 21.00 | C-1 | 49.00 | 1.80 |
| Example 7 | A-1 | 28.16 | B-3 | 21.00 | C-1 | 49.00 | 1.80 |
| Example 8 | A-2 | 28.16 | B-1 | 21.00 | C-1 | 49.00 | 1.80 |
| Example 9 | A-3 | 28.16 | B-1 | 21.00 | C-1 | 49.00 | 1.80 |
| Example 10 | A-4 | 28.16 | B-1 | 21.00 | C-1 | 49.00 | 1.80 |
| Example 11 | A-5 | 28.16 | B-1 | 21.00 | C-1 | 49.00 | 1.80 |
| Example 12 | A-6 | 28.16 | B-1 | 21.00 | C-1 | 49.00 | 1.80 |
| Example 13 | A-7 | 28.16 | B-1 | 21.00 | C-1 | 49.00 | 1.80 |
| Example 14 | A-1 | 28.16 | B-4 | 21.00 | C-1 | 49.00 | 1.80 |
| Example 15 | A-1 | 28.16 | B-5 | 21.00 | C-1 | 49.00 | 1.80 |
| Example 16 | A-1 | 28.16 | B-1 | 21.00 | C-3 | 49.00 | 1.80 |
| Example 17 | A-1 | 28.16 | B-1 | 7.00 | C-1 | 63.00 | 1.80 |
| Example 18 | A-1 | 28.16 | B-1 | 21.00 | C-4 | 49.00 | 1.80 |
| Example 19 | A-1 | 29.06 | B-1 | 21.00 | C-1 | 49.00 | 0.90 |
| Example 20 | A-1 | 29.66 | B-1 | 21.00 | C-1 | 49.00 | 0.30 |
| Example 21 | A-1 | 22.46 | B-1 | 21.00 | C-1 | 49.00 | 7.50 |
| Example 22 | A-1 | 29.96 | B-1 | 21.00 | C-1 | 49.00 | 0.00 |
| Comparative Example 1 | A-1 | 28.16 | B-6 | 21.00 | C-1 | 49.00 | 1.80 |
| Comparative Example 2 | A-1 | 28.16 | B-1 | 21.00 | — | — | 1.80 |
| Comparative Example 3 | A-1 | 28.16 | — | — | C-1 | 70.00 | 1.80 |
| Comparative Example 4 | A-1 | 28.16 | B-1 | 21.00 | C-5 | 49.00 | 1.80 |
| Comparative Example 5 | A-1 | 28.16 | B-7 | 21.00 | C-5 | 49.00 | 1.80 |
| Comparative Example 6 | A-1 | 28.16 | B-1 | 21.00 | C-1 | 49.00 | 1.80 |
| Comparative Example 7 | A-8 | 28.16 | B-1 | 21.00 | C-1 | 49.00 | 1.80 |
| Comparative Example 8 | A-9 | 28.16 | B-7 | 21.00 | C-1 | 49.00 | 1.80 |
| Comparative Example 9 | A-1 | 28.16 | B-8 | 21.00 | C-1 | 49.00 | 1.80 |

Compounds given in the table are as follows.

<(A) Polymer>

(A-1) SEPTON S2104 (polystyrene-based elastomer, styrene content of 65%, hydrogenated, and 5% thermal mass reduction temperature=400° C., manufactured by Kuraray Co., Ltd.)

(A-2) TUFTEC P2000 (polystyrene-based elastomer, styrene content of 67%, hydrogenated, and 5% thermal mass reduction temperature=400° C., manufactured by Asahi Kasei Co., Ltd.)

(A-3) TUFTEC P5051 (polystyrene-based elastomer, styrene content of 47%, hydrogenated, and 5% thermal mass reduction temperature=396° C., manufactured by Asahi Kasei Co., Ltd.)

(A-4) SEPTON S2006 (polystyrene-based elastomer, styrene content of 35%, hydrogenated, and 5% thermal mass reduction temperature=392° C., manufactured by Kuraray Co., Ltd.)

(A-5) SEPTON S2007 (polystyrene-based elastomer, styrene content of 30%, hydrogenated, and 5% thermal mass reduction temperature=390° C., manufactured by Kuraray Co., Ltd.)

(A-6) SEPTON S2005 (polystyrene-based elastomer, styrene content of 20%, hydrogenated, and 5% thermal mass reduction temperature=380° C., manufactured by Kuraray Co., Ltd.)

(A-7) ASAPRENE T-439 (polystyrene-based elastomer, styrene content of 45%, non-hydrogenated, and 5% thermal mass reduction temperature=380° C., manufactured by Asahi Kasei Co., Ltd.)

(A-8) PSJ-polystyrene HF-77 (polystyrene, styrene content of 100%, non-hydrogenated, and 5% thermal mass reduction temperature=400° C., manufactured by PS Japan Co., Ltd.)

(A-9) Nipol 1043 (acrylonitrile butadiene rubber, styrene content of 0%, non-hydrogenated, and 5% thermal mass reduction temperature=370° C., manufactured by Zeon Corporation)

<(B) Solvent Having Boiling Point of 160° C. or Higher>

(B-1) Mesitylene (boiling point of 165° C., and SP value of 18.0 $(MPa)^{1/2}$, manufactured by Toyo Gosei Co., Ltd.)

(B-2) p-Diisopropylbenzene (boiling point of 210° C., and SP value of 17.6 $(MPa)^{1/2}$, manufactured by Tokyo Chemical Industry Co., Ltd.)

(B-3) p-Diethylbenzene (boiling point of 181° C., and SP value of 18.0 $(MPa)^{1/2}$, manufactured by Toray Co., Ltd.)

(B-4) m-Diethylbenzene (boiling point of 182° C., and SP value of 17.8 $(MPa)^{1/2}$, manufactured by Toray Co., Ltd.)

(B-5) 1,3,5-Triethylbenzene (boiling point of 218° C., and SP value of 18.0 $(MPa)^{1/2}$, manufactured by Tokyo Chemical Industry Co., Ltd.)

(B-6) p-Xylene (boiling point of 139° C., and SP value of 17.9 $(MPa)^{1/2}$, manufactured by Mitsubishi Gas Chemical Co., Ltd.)

(B-7) Decahydronaphthalene (boiling point of 186° C., and SP value of 18.0 $(MPa)^{1/2}$, manufactured by Nippon Steel & Sumikin Chemical Co., Ltd.)

(B-8) 1,2,3,4-tetrahydronaphthalene (boiling point of 207° C., and SP value 19.9 $(MPa)^{1/2}$, manufactured by Nippon Steel & Sumikin Chemical Co., Ltd.)

<(C) Solvent Having Boiling Point of Lower than 120° C.>

(C-1) Cyclohexane (boiling point of 81° C., and SP value 16.8 $(MPa)^{1/2}$, manufactured by Idemitsu Kosan Co., Ltd.)

(C-2) Toluene (boiling point of 111° C., and SP value of 18.2 $(MPa)^{1/2}$, manufactured by JX Nippon Oil & Energy Corporation)

(C-3) Tetrahydrofuran (boiling point of 66° C., and SP value of 19.5 $(MPa)^{1/2}$, manufactured by Kishida Chemical Co., Ltd.)

(C-4) Methyl cyclohexane (boiling point of 101° C., and SP value of 16.0 $(MPa)^{1/2}$, manufactured by Sankyo Chemical Co., Ltd.)

(C-5) Butyl acetate (boiling point of 126° C., and SP value of 17.4 $(MPa)^{1/2}$, manufactured by Kishida Chemical Co., Ltd.)

Incidentally, a 5% thermal mass reduction temperature of (A) polymer was measured by the following method.

<5% Thermal Mass Reduction Temperature>

Using a thermogravimetric analyzer Q500 (manufactured by TA Co., Ltd.), 2 mg of a sample was heated on an aluminum pan under a nitrogen stream of 60 mL/min and constant increasing conditions of 20° C./min from an initial temperature of 25° C., and the temperature when the mass of the sample had been reduced by 5 mass % was measured.

<Preparation of Sheet>

Each composition was coated at a rate of 1 m/min on a polyethylene terephthalate film (peeling film) having a thickness of 75 μm by a wire bar, and dried at 140° C. for 10 minutes to prepare a sheet having a thickness of 100 μm. The peeling film was left as it was, thereby serving as a peeling film-attached sheet.

For a sheet having strong surface tackiness, a polyethylene terephthalate film (peeling film) having a thickness of 75 μm was further bonded onto the coated surface of the sheet.

<Preparation of Adhesive Support Substrate>

The sheet (peeling film-attached sheet) obtained in the above manner was set in a vacuum laminator, the film on one side of the sheet was peeled in a case of having a polyethylene terephthalate film (peeling film) on both sides, the sheet was positioned on a 100 mm Si wafer, the sheet surface and the Si wafer were brought into contact under vacuum, and the sheet and the Si wafer were fixed by a roller, thereby preparing an adhesive support substrate. Here, the polyethylene terephthalate film (peeling film) remaining on the top of the adhesive support substrate was left without peeling thereof.

<Preparation of Test Piece>

After the polyethylene terephthalate film (peeling film) of the adhesive support substrate was peeled off, the sheet surface of the adhesive support substrate and the device surface of the device wafer were subjected to compression under vacuum, at 110° C. and a pressure of 0.11 MPa for 3 minutes, thereby preparing a test piece. The device wafer used was a Si wafer having bumps with a diameter of 80 μm and a height of 40 nm and made of copper formed at a pitch of 200 μm on a 100 mm Si wafer.

<Evaluation>

<<Evaluation of Solubility>>

The composition was mixed in a ratio shown in Table 1. Further, (A) polymer in Table 1 was added to prepare a sample having a concentration of solid contents of 31 mass %.

The undissolved sample was completely dissolved with the addition of the following solvents.

(Additionally Added Solvent)

In the composition to which (B) solvent and (C) solvent were added, a mixed solvent of (B) solvent and (C) solvent mixed at a mass ratio added to each composition was added.

In the composition to which (B) solvent alone was added, (B) solvent was added.

In the composition to which (C) solvent alone was added, (C) solvent was added.

(Evaluation Standards)

A: It was capable of preparing a sample having a concentration of solid contents of 31 mass %.

B: It was capable of preparing a sample having a concentration of solid contents of 30 mass % or more and less than 31 mass %.

C: It was capable of preparing a sample having a concentration of solid contents of 29 mass % or more and less than 30 mass %.

D: It was capable of preparing a sample having a concentration of solid contents of less than 29 mass %.

<<Surface Morphology>>

The composition was applied onto a polyethylene terephthalate film (peeling film) so as to have a film thickness of 100 μm after drying, and surface morphology of the film after drying for 10 minutes at 140° C. was visually observed. The evaluation was made according to the following standards.

A: Drying unevenness and thickness unevenness were not observed.

B: Drying unevenness and thickness unevenness were partially observed.

C: Drying unevenness and thickness unevenness were observed over the entire surface.

<<Drying Properties>>

The composition was applied onto a polyethylene terephthalate film (peeling film) so as to have a film thickness of 100 μm after drying, and drying properties of the film after drying for 10 minutes at 140° C. were evaluated according to the following standards.

A: There was no tackiness of surface due to being completely dried.

B: The solvent was not volatilized in part and therefore tackiness of surface was observed at the place of unvolatilized solvent.

C: The solvent was not completely volatilized over the entire surface and therefore tackiness of surface was observed.

D: The solvent has remained and the surface remains with a liquid of a high viscosity.

<<Heat Resistance>>

The test piece was heated using an oven at 250° C. for 1 hour. The test piece after heating, together with a dicing frame, was set in the center of a dicing tape mounter and then a dicing tape was positioned from above. The test piece and the dicing tape were fixed by a roller (and under vacuum), the dicing tape was cut on the dicing frame, and the test piece was mounted on the dicing tape.

The test piece was pulled in the vertical direction of the sheet under the conditions of 500 mm/min to confirm the peelability and an evaluation was carried out according to the following standards. Further, the presence or absence of breakage of the Si wafer was visually confirmed.

A: It was capable of being peeled with a maximum peel force of less than 10 N.

B: It was capable of being peeled with a maximum peel force of 10 N or more and less than 15 N.

C: It was capable of being peeled with a maximum peel force of 15 N or more and less than 20 N.

D: It was capable of being peeled with a maximum peel force of 20 N or more, but the Si wafer was damaged.

<<Laminatability>>

In the production of an adhesive support substrate, laminatability of a sheet when laminating the sheet on a Si wafer was evaluated according to the following standards.

A: The sheet was completely melted and bonded to the Si wafer without voids.

B: The sheet was insufficiently melted and voids were observed in a part of the sheet.

C: The sheet was insufficiently melted and voids were observed over the entire surface of the sheet.

TABLE 2

| | Solubility | Surface morphology | Drying properties | Heat resistance |
|---|---|---|---|---|
| Example 1 | A | A | A | A |
| Example 2 | A | A | A | A |
| Example 3 | A | A | A | A |
| Example 4 | A | A | B | A |
| Example 5 | A | A | C | A |
| Example 6 | A | A | A | A |
| Example 7 | A | A | A | A |
| Example 8 | A | A | A | A |
| Example 9 | A | A | A | A |
| Example 10 | A | A | A | B |
| Example 11 | A | A | A | B |
| Example 12 | A | A | A | B |
| Example 13 | A | A | A | B |
| Example 14 | A | A | A | A |
| Example 15 | A | A | A | A |
| Example 16 | B | B | A | A |
| Example 17 | B | A | A | A |
| Example 18 | A | A | A | A |
| Example 19 | A | A | A | A |
| Example 20 | A | A | A | B |
| Example 21 | B | B | A | A |
| Example 22 | A | A | A | C |
| Comparative Example 1 | A | C | A | A |
| Comparative Example 2 | A | C | D | A |
| Comparative Example 3 | B | C | A | A |
| Comparative Example 4 | B | C | C | A |
| Comparative Example 5 | C | B | D | A |
| Comparative Example 6 | A | A | A | D |
| Comparative Example 7 | A | A | A | D |
| Comparative Example 8 | C | A | C | A |
| Comparative Example 9 | C | A | C | A |

TABLE 3

| | Laminatability |
|---|---|
| Example 1 | A |
| Example 19 | B |
| Example 20 | B |
| Example 21 | A |
| Example 22 | C |

As can be seen from the above results, the compositions of Examples were capable of forming a sheet having good solubility and excellent drying properties, surface morphology and heat resistance. Further, by incorporating an antioxidant, it was also capable of improving laminatability.

In contrast, Comparative Examples 1 to 9 exhibited poor solubility, drying properties, surface morphology, and heat resistance.

EXPLANATION OF REFERENCES

11: Sheet
12: Support substrate
60: Device wafer
60*a*: Thin device wafer
61: Silicon substrate
61*a*: Surface
61*b*, 61*b*1: Rear surface
62: Device chip
63: Structure
100: Adhesive support substrate

What is claimed is:

1. A composition comprising:
   an elastomer having a 5% thermal mass reduction temperature of 375° C. or higher when heated at an elevation rate of 20° C./min from 25° C.;
   a solvent represented by the following General Formula (1) and having a boiling point of 181° C. or higher; and
   a solvent having a boiling point of lower than 120° C.,

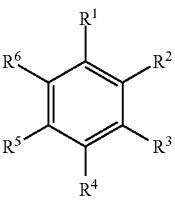

(1)

in General Formula (1), $R^1$ to $R^6$ each independently represents a hydrogen atom or an aliphatic hydrocarbon group, provided that at least one of $R^1$ to $R^6$ in General Formula (1) is an aliphatic hydrocarbon group having 2 to 20 carbon atoms, and wherein the solvent having a boiling point of 181° C. or higher has a SP value of 17.8 $(MPa)^{1/2}$ or less.

2. The composition according to claim 1, wherein the content of the elastomer in the composition is 25 mass % or more.

3. The composition according to claim 1, wherein the elastomer is an elastomer containing a styrene-derived repeating unit.

4. The composition according to claim 1, wherein the elastomer is a hydrogenated product.

5. The composition according to claim 1, wherein the elastomer is a styrene block polymer whose one terminal or both terminals are a styrene block.

6. The composition according to claim 1, wherein the elastomer has a styrene content of 40 mass % or more.

7. The composition according to claim 1, wherein the solvent having a boiling point of lower than 120° C. has a SP value of 19 $(MPa)^{1/2}$ or less.

8. The composition according to claim 1, wherein the solvent having a boiling point of lower than 120° C. is one or more selected from the group consisting of an aromatic hydrocarbon, an alicyclic hydrocarbon, and a cyclic ether.

9. The composition according to claim 1, wherein the content of the solvent having a boiling point of lower than 120° C. in the composition is 10 to 60 mass %.

10. The composition according to claim 1, wherein the mass ratio of the solvent having a boiling point of 181° C. or higher to the solvent having a boiling point of lower than 120° C. is 80:20 to 99:1.

11. The composition according to claim 1, further comprising an antioxidant.

12. The composition according to claim 11, wherein the content of the antioxidant in the composition is 1 to 7 mass %.

13. The composition according to claim 1, wherein the composition is for the formation of a sheet.

14. The composition according to claim 1, wherein the composition is a temporary fixing adhesive composition.

15. A process for producing a sheet, comprising:
applying the composition according to claim 1 onto a support; and
drying the applied composition.

16. A sheet obtained by drying the composition according to claim 1.

17. A laminate comprising:
a sheet obtained by drying the composition according to claim 1; and
a support having releasability which is provided on one or both sides of the sheet.

18. A laminated comprising:
a support substrate, a device wafer, and a sheet obtained by drying the composition according to claim between the device wafer and the support substrate,
wherein one surface of the sheet is in contact with the device surface of the device wafer, and the other surface of the sheet is in contact with the surface of the support substrate.

19. The composition according to claim 1, wherein the composition includes 50 to 75 mass % of the solvent having a boiling point of 181° C. or higher.

* * * * *